United States Patent
Koutani et al.

(10) Patent No.: US 7,417,486 B2
(45) Date of Patent: Aug. 26, 2008

(54) VOLTAGE-CURRENT CONVERSION CIRCUIT, AMPLIFIER, MIXER CIRCUIT, AND MOBILE APPLIANCE USING THE CIRCUIT

(75) Inventors: Masato Koutani, Kitakatsuragi-gun (JP); Kunihiko Iizuka, Sakai (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 38 days.

(21) Appl. No.: 11/238,823

(22) Filed: Sep. 28, 2005

(65) Prior Publication Data

US 2006/0066362 A1 Mar. 30, 2006

(30) Foreign Application Priority Data

Sep. 28, 2004 (JP) ............... 2004-281099
Jan. 24, 2005 (JP) ............... 2005-015406

(51) Int. Cl.
G06F 7/44 (2006.01)
(52) U.S. Cl. ............ 327/359; 327/355; 327/103; 455/326; 455/333
(58) Field of Classification Search ......... 327/355–359, 327/100, 103; 330/560–563; 455/326, 333
See application file for complete search history.

(56) References Cited

U.S. PATENT DOCUMENTS

| | | | | |
|---|---|---|---|---|
| 5,448,772 A * | 9/1995 | Grandfield | ............ | 455/333 |
| 5,630,228 A * | 5/1997 | Mittel | ............ | 455/333 |
| 5,699,024 A * | 12/1997 | Manlove et al. | ............ | 331/111 |
| 5,809,410 A * | 9/1998 | Stuebing et al. | ............ | 455/326 |
| 5,875,392 A * | 2/1999 | Tanaka | ............ | 455/321 |
| 5,933,771 A * | 8/1999 | Tiller et al. | ............ | 455/333 |
| 5,999,804 A * | 12/1999 | Forgues | ............ | 455/333 |
| 6,026,286 A * | 2/2000 | Long | ............ | 455/327 |
| 6,029,059 A | 2/2000 | Bojer | ............ | 455/326 |
| 6,078,207 A * | 6/2000 | Oguri | ............ | 327/321 |
| 6,407,620 B1 * | 6/2002 | Hirayama | ............ | 327/538 |
| 6,512,408 B2 * | 1/2003 | Lee et al. | ............ | 455/333 |
| 6,559,706 B2 * | 5/2003 | Johnson | ............ | 327/359 |
| 6,831,497 B2 * | 12/2004 | Koh et al. | ............ | 327/254 |

(Continued)

FOREIGN PATENT DOCUMENTS

JP 4-129407 A 4/1992

OTHER PUBLICATIONS

Aoki, H. (1992). "Introduction to Functional Circuit Design of ICs," CQ Publishing, pp. 118-121. (In Japanese with brief description of relevance).

(Continued)

*Primary Examiner*—N. Drew Richards
*Assistant Examiner*—Hai L. Nguyen
(74) *Attorney, Agent, or Firm*—Morrison & Foerster LLP

(57) ABSTRACT

A cross-coupled low-distortion voltage-current conversion circuit has transistors T1 to T6. At least one of the transistors has parallel connections of two or more transistors. By arbitrarily setting the number of parallel connections of the transistors T1 to T6, the current distributions of the circuits are optimized while maintaining the conventional low-distortion operation. The invention finds applications in amplifiers and mixers that need to be operated with low distortion and low power consumption. The invention provides a cross-coupled low-distortion voltage-current conversion circuit that has freedom of design and improved performance without increasing power consumption over the entire circuit.

38 Claims, 15 Drawing Sheets

U.S. PATENT DOCUMENTS 6,871,057 B2 * 3/2005 Ugajin et al. ............... 455/323

OTHER PUBLICATIONS

Harvey, J. et al. (2001). "Analysis and Design of an Integrated Quadrature Mixer with Improved Noise, Gain, and Image Rejection," *IEEE International Symposium on Circuits and Systems* 4:786-789.

Lee, T.H. (1998). "Mixers," Chapter 12 in *The Design of CMOS Radio-Frequency Integrated Circuits*, Cambridge University Press, United Kingdom, pp. 325-329.

Yue, S. (Apr. 9, 2001). "Linearization Techniques for Mixers," pp. 1-13.

* cited by examiner

Prior Art

VOLTAGE-CURRENT CONVERSION CIRCUIT, AMPLIFIER, MIXER CIRCUIT, AND MOBILE APPLIANCE USING THE CIRCUIT

This non-provisional application claims priority under 35 U.S.C. §119(a) on Japanese Patent Applications Nos. 2004-281099 filed in Japan on Sep. 28, 2004, and 2005-15406 filed in Japan on Jan. 24, 2005, the entire contents of which are hereby incorporated by reference.

BACKGROUND OF THE INVENTION

The present invention generally relates to voltage-current conversion circuits, and more particularly to a voltage-current conversion circuit that realizes low distortion and low power consumption in the transconductance stage (or gm stage). The present invention also relates to an amplifier, mixer circuit, and mobile appliance, all of which utilize this voltage-current conversion circuit.

The digital terrestrial television broadcasting (ISDB-T) in Japan uses one segment (430 kHz) for mobile appliances. To make the function of receiving the digital terrestrial television broadcasting carried out by ICs (integrated circuits) and to incorporate the ICs into battery-driven mobile terminals, low power consumption, size reduction, immunity to interferences, and low distortion of the receiving tuner are important considerations.

In a low-IF (Intermediate Frequency) receiver system with a function of image rejection, the mixer circuit is one of the most important blocks. Conventionally, mixer circuits have a transconductance stage, that is, a voltage-current conversion circuit that amplifies input signal voltage V and converts it into current signal I, as shown in FIG. 10. When RF (Radio Frequency) input signals (RF,RFB) are inputted into transistors T1 and T2 (the voltage of a small signal between $V_{BE1}$ and $V_{BE2}$: $V_{in}=V_{in+}-V_{in-}$), currents $I_{out3}$ and $I_{out4}$ respectively represented by the following formulas (1) and (2) flow. It is noted that $I_{out3}+I_{out4}=I_{SS}$.

[Mathematical Formula I]

$$I_{out3} = \frac{I_{SS}\exp\frac{V_{in}}{V_T}}{\left(1+\exp\frac{V_{in}}{V_T}\right)} = \frac{I_{SS}}{\left(1+\exp\frac{-V_{in}}{V_T}\right)} \quad (1)$$

$$I_{out4} = \frac{I_{SS}}{\left(1+\exp\frac{V_{in}}{V_T}\right)} \quad (2)$$

According to this prior art, formulas (1) and (2) contain non-linear terms (exp), which means occurrence of distortion.

Also conventionally used is a voltage-current conversion circuit with cross-coupling as shown in FIG. 11. This voltage-current conversion circuit has first transistor T1 and second transistor T2 into which input signals (RF, RFB) are inputted from a base, third transistor T3 whose collector is connected to the emitter terminal of first transistor T1, and fourth transistor T4 whose collector is connected to the emitter terminal of second transistor T2. The bases of third and fourth transistors T3 and T4 are cross-coupled to each other's collectors. Resistor R7 is provided between the emitters of third and fourth transistors T3 and T4. In this voltage-current conversion circuit, when RF is inputted into transistors T1 and T2, currents $I_{out3}$ and $I_{out4}$ respectively represented by the following formulas (3) and (4) flow.

[Mathematical Formulas II]

$$I_{out3} = I_{SS} - \frac{V_{in}}{R_7} \quad (3)$$

$$I_{out4} = I_{SS} + \frac{V_{in}}{R_7} \quad (4)$$

These formulas do not contain non-linear terms (exp), and therefore linearity improves. However, this circuit presents the problem of unstable operation upon input of high-frequency signals into first transistor T1 and second transistor T2 (the problem including unexpected oscillations with the base and collector in a common-mode with each other).

In the mixer circuit, there is a trade-off relationship between low distortion and low power consumption of the transconductance stage (or gm stage) (amplifier). To solve the above problem, non-patent document 1 discloses a technique of low distortion of a transconductor with cross-coupling, as shown in FIG. 12.

Referring to FIG. 12, transconductance stage (or gm stage) s100 has first transistor T1 and second transistor T2. Respective collectors are connected to respective power source terminals, and input signals (RF, RFB) are inputted into first and second transistors T1 and T2 from respective bases. Transconductance stage (or gm stage) s100 also has third transistor T3 whose collector is connected to the emitter terminal of first transistor T1, and fourth transistor T4 whose collector is connected to the emitter terminal of second transistor T2. The bases of third and fourth transistors T3 and T4 are cross-coupled to each other's collectors. Transconductance stage (or gm stage) s100 further has fifth transistor T5 that shares the base and emitter with third transistor T3 and acquires a current signal from the collector, and sixth transistor T6 that shares the base and emitter with fourth transistor T4 and acquires a current signal from the collector. Third transistor T3 and fifth transistor T5 (fourth transistor T4 and sixth transistor T6) constitute a current mirror. The current mirror ratio here is 1:1. Resistor R7 is provided between the emitters of fifth and sixth transistors T5 and T6 (T3 and T4), emitter terminals 1 and 2 of these transistors are respectively provided with constant current sources $I_{in1}$ and $I_{in2}$.

Transconductance stage (or gm stage) s100 amplifies input signal voltage $V_{in}$ and converts it into a current signal.

In transconductance stage (or gm stage) s100 shown, since the currents that flow through transistors T1 and T3 (T2 and T4) are equal, the following formulas (5) and (6) are obtained.

[Mathematical Formula III]

$$V_{BE1}+V_{BE4}=V_{BE2}+VBE3 \quad (5)$$

$$V_{BE1}=V_{BE3},\ V_{BE2}=V_{BE4} \quad (6)$$

When RF is inputted into transistors T1 and T2 (the voltage of a small signal between $V_{BE1}$ and $V_{BE2}$: $V_{in}=V_{in+}-V_{in-}$), RF signal $V_{in}$ is directly fed into resistor R7, so that a signal current represented by formula (7) flows across resistor R7.

[Mathematical Formula IV]

$$i_{R_7} = \frac{v_{in}}{R_7} \quad (7)$$

Currents $I_{out3}$ and $I_{out4}$ are respectively represented by formulas (8) and (9).

[Mathematical Formula V]

$$I_{out3} = \frac{1}{2}\left(I_{SS} - \frac{v_{in}}{R_7}\right) \quad (8)$$

$$I_{out4} = \frac{1}{2}\left(I_{SS} + \frac{v_{in}}{R_7}\right) \quad (9)$$

These do not contain non-linear terms (e.g., ln and exp) similar to the conventional principles as (3),(4), and current mirror structures based on conventional cross-coupled principle, provide for low distortion operation. Transconductances gm 3 and gm 4 are as represented by formula (10) obtained by differentiating formulas (8) and (9).

[Formula VI]

$$gm3 = gm4 = \frac{1}{2R_7} \quad (10)$$

As an example of a conventional IQ mixer, patent document 1 and non-patent document 2 propose a quadrature mixer as shown in FIG. 13.

In this figure, the transconductance stage (or gm stage) will be referred to as Gm, and the SW (switch) stage of I or Q as SW_I or SW_Q. High-frequency signal RF and its inversed signal will be respectively referred to as RF and RFB, local signal and its inverse signal respectively as LO_I (LO_Q) and LO_IB (LO_QB), and intermediate-frequency signal IF (intermediate frequency) and its inversed signal respectively as IF_I (IF_Q) and IF_IB (IF_QB).

Referring to FIG. 13, quadrature mixer q100 has: I switching portion SW_I that generates, from the first signal (RF, RFB) and the second signal (LO_I, LO_IB), a third signal (IF_I, IF_IB) as the product; and Q switching portion SW_Q that generates, from the first signal (RF, RFB) and the fourth signal (LO_Q, LO_QB), a fifth signal (IF_Q, IF_QB) as the product. Transconductance stage (or gm stage) Gm, which amplifies the first signal (RF, RFB) and inputs the amplified signal into switching portions SW_I and SW_Q as a current signal, is common.

The operation of mixer circuit q100 will be described referring to FIG. 13. I mixer (Gm–SW_I) and Q mixer (Gm–SW_Q) multiply high-frequency signal RF, which is a received signal, respectively by local signal LO_I and local signal LO_Q and carry out frequency conversion. As the multiplication results, the mixers respectively generate intermediate-frequency signal IF_I and intermediate-frequency signal IF_Q.

By making input transconductance stage (or gm stage) Gm common, not only the number of elements are decreased, but there is a possibility of a decrease in power by half, low distortion, and low noise, compared with two independent Gilbert cell mixers.

Further, with the quadrature mixer, when the local signal has a sine wave or triangular wave, a point of intersection of quadrature signals I, IB, Q, and QB appears at π/2 intervals, even though IQ balance of the local signals are not good, as shown in FIG. 14(*b*). Owing to this IQ mutual interference, output phase errors caused by local signals can be relaxed However, when input is in a square wave as shown in FIG. 14(*a*), the points of intersection become vague, making it impossible to amend output phase errors. Since the image rejection ratio (the ratio of the desired wave to the interfering wave) is determined by the output phase error and amplitude error of the mixer, in recent years the quadrature mixer has been referred to in literature of various types as an image rejection mixer with the function of amending phase errors.

Patent document 2 discloses a mixer circuit as shown in FIG. 15. Mixer circuit m100 has transconductance stage (or gm stage) Gm, switching portion SW that carries out frequency conversion, and current paths $I_{p1}$ and $I_{p2}$. Bypass currents $I_{p1}$ and $I_{p2}$ enable independent optimization of the operation currents of switching portion SW and transconductance stage (or gm stage) Gm.

Patent document 1: U.S. Pat. No. 6,029,059

Patent document 2: Japanese Patent Publication No. 4-129407

Non-patent document 1: Hidehiko Aoki "Introduction to Functional Circuit Design of ICs" CQ Publishing, 1992.

Non-patent document 2: Jackson Harvey and Ramesh Harjani "Analysis and Design of an Integrated Quadrature Mixer with Improved Noise Gain and Image Rejection" IEEE International Symposium Circuits and Systems vol. IV pp. 786-789 May 2001.

However, the structure of the transconductance stage (or gm stage) shown in FIG. 12 has such a current relationship that $I_{out3}:I_{out5}=I_{out4}:I_{out6}=1:1$, and a current of approximately half $I_{in1}$ ($I_{in2}$) flows through $I_{out3}$ ($I_{out4}$). This restricts freedom of design; when reducing distortion and improving gain by increasing the currents for transistors T5 and T6, which are central to differential amplification operation, the circuit configuration requires an approximately twice as much current as the currents that flow through optimized transistors T5 and T6. Thus, power consumption cannot be prevented from increasing.

SUMMARY OF THE INVENTION

In view of the foregoing and other problems, it is an object of the present invention to provide a voltage-current conversion circuit that, in relation to the transconductance stage (or gm stage) which realizes low distortion, reduces power consumption by a circuit design that enables adjustment for a more suitable operation current.

It is another object of the present invention to provide an amplifier that utilizes the voltage-current conversion circuit.

It is another object of the present invention to provide a mixer circuit that utilizes the voltage-current conversion circuit.

It is another object of the present invention to provide a mobile appliance that utilizes the voltage-current conversion circuit.

According to a first aspect of the present invention, there is provided a voltage-current conversion circuit comprising a transconductance stage (or gm stage) for carrying out voltage-current conversion, the transconductance stage (or gm stage) comprising: a first transistor and a second transistor each comprising a collector connected to a respective power source terminal, and each receiving an input signal from a respective base; a third transistor comprising a collector connected to an emitter terminal of the first transistor and a fourth transistor comprising a collector connected to an emitter terminal of the second transistor, the collector of the third transistor being cross-coupled to a base of the fourth transistor, and the collector of the fourth transistor being cross-coupled to a base of the third transistor; a fifth transistor for acquiring a current signal from a collector of the fifth transistor, the fifth transistor and the third transistor sharing the base and an emitter: and a sixth transistor for acquiring a current signal from a collector of the sixth transistor, the sixth transistor and the fourth transistor sharing the base and an emitter. A resistor is located between the emitters of the fifth transistor and the sixth transistor. The number of parallel connections of or the sizes in the first to sixth transistors has an arbitrary ratio. Setting such an arbitrary ratio adjusts the amount of signal currents flowing through the fifth transistor and the sixth transistor relative to the entire amount of current.

According to this invention, a new parameter, which is either the ratio of the number of parallel connections or the size ratio, is introduced while maintaining the conventionally proposed low-distortion amplification operation. This relaxes a design of gm stages. Further, the current distributions for the fifth and sixth transistors are optimized (improvement of gm). By controlling the operation current by the ratio of the number of parallel connections of the transistors (herein referred to as the current mirror ratio) or the size ratio thereof, the operation current is utilized effectively, providing for low power consumption.

The resistor located between the emitters of the fifth and sixth transistors may be replaced with an inductor. Employment of an inductor as the negative feedback reduces the adverse effects of thermal noise caused by a negative feedback resistor. The resistance component of the inductor is represented by $Z_L=2\pi fL$, where f indicates the frequency. That is to say, as the frequency becomes high, the negative feedback effect improves, thus alleviating distortion. In the cross-coupling structure, the tendency of gradual degradation of distortion with an increase in the frequency can be confirmed by calculation. It is therefore preferable for the element to be able to compensate for high frequencies such as with the inductor. In practice, it is preferable to take into account the fact that gain and linearity are frequency-dependent, and an increase in the chip area caused by the inductor.

The resistor located between the emitters of the fifth and sixth transistors may be replaced with a capacitor. Employment of a capacitor as the negative feedback reduces the adverse effects of thermal noise caused by a negative feedback resistor. The resistance component of the capacitor is represented by $Z_c=1/2\pi fC$, where f indicates the frequency. That is to say, as the frequency becomes low, the negative feedback effect improves, thus alleviating distortion. In practice, it is preferable to take into account the fact that gain and linearity are frequency-dependent.

The resistor located between the emitters of the fifth and sixth transistors may be replaced with a resistor and an inductor connected in-series to the resistor. This balances the trade-off between frequency variations of gain and linearity caused by the inductor and noise caused by the resistor.

The resistor located between the emitters of the fifth and sixth transistors may be replaced with a resistor and a capacitor connected in-series to the resistor. This balances the trade-off between frequency variations of gain and linearity caused by the capacitor and noise caused by the resistor.

In a preferred embodiment of the present invention, the fifth transistor and the sixth transistor may each comprise a current source added to an emitter terminal of each transistor. By addition of a constant current source, the operation current is kept uniform, restraining fluctuation in input common-mode potential, which is determined by load resistance and the operation current.

Instead of providing a current source, a negative feedback resistor may be added each between the emitter terminal of the fifth transistor, to which the above resistor is added, and the ground of the fifth transistor, and between the emitter terminal of the sixth transistor, to which the above resistor is added, and the ground of the sixth transistor. This structure reduces the number of transistors stacked vertically (because of the absence of the current source transistor), increases operation margin, and provides for improved performances such as linearity, though with added difficulty in keeping the operation current uniform.

In another preferred embodiment of the present invention, the parallely connected transistors of each of the first to sixth transistors may comprise equal voltages between respective bases and emitters. Under the conditions that the base-emitter voltages are equal and all the parallel connections of transistor are of the same size, this structure enables control of the current mirror ratio that depends only on the parameter (the number of parallel connections).

More preferably, the number of parallel connections of the first transistor and the number of parallel connections of the third transistor are equal, and the number of parallel connections of the second transistor and the number of parallel connections of the fourth transistor are equal.

Considering that the conventional basic operation principle is determined by transistors T1 to T4 and emitter resistor R7, if the currents flowing through the first and third transistors are equal and the currents flowing through the second and fourth transistors are equal, an input signal is directly fed into emitter resistor R7 of the third and fourth (fifth and sixth) transistors without being affected by parallel connection. As in the prior art, there are no non-linear terms (e.g., ln and exp), providing for low-distortion amplification operation.

In another preferred embodiment of the present invention, a bias is inputted into a base terminal of the first transistor and into a base terminal of the second transistor via two resistors, and the first transistor and the second transistor each receive an input signal via a capacitor.

With this invention, the base voltage of the signal inputted transistor is uniform in receiving a differential input signal.

In another preferred embodiment of the present invention, a bias is inputted into a base terminal of the first transistor and into a base terminal of the second transistor via two resistors, and one of the first transistor and the second transistor is grounded via a capacitor, and the other transistor receives an input signal via a capacitor.

This structure enables single-differential conversion. Further, since this structure is in the cross-coupling structure, there is little deterioration of performance resulting from single input.

In another preferred embodiment of the present invention, a bias may be inputted into a base terminal of the first transistor and into a base terminal of the second transistor via two resistors, one of the first transistor and the second transistor being supplied with the bias alone, while the other transistor receiving an input signal via a capacitor.

According to a second aspect of the present invention, there is provided an amplifier comprising: a first transistor and a second transistor each comprising a collector connected to a respective power source terminal, and each receiving an input signal from a respective base; a third transistor comprising a collector connected to an emitter terminal of the first transistor and a fourth transistor comprising a collector connected to an emitter terminal of the second transistor, the collector of the third transistor being cross-coupled to a base of the fourth transistor, and the collector of the fourth transistor being cross-coupled to a base of the third transistor; a fifth transistor for acquiring a current signal from a collector of the fifth transistor, the fifth transistor and the third transistor sharing the base and an emitter: and a sixth transistor for acquiring a current signal from a collector of the sixth transistor, the sixth transistor and the fourth transistor sharing the base and an emitter. A resistor is provided between the emitters of the fifth transistor and the sixth transistor, and a current source is added to an emitter terminal of each of the fifth transistor and the sixth transistor. An output load resistor is connected to each collector terminal of the fifth transistor and the sixth transistor. At least one of the first to sixth transistors comprises parallel connections comprising two or more transistors. The number of parallel connections of the first to sixth transistors has an arbitrary ratio, setting such an arbitrary ratio adjusting the amount of signal currents flowing through the fifth transistor and the sixth transistor relative to the entire amount of current.

This invention provides an amplifier that realizes lower power consumption and low-distortion operation, compared with conventional amplifiers. In addition, the presence of a constant current source causes the operation current to be kept uniform, restraining fluctuation in output voltage.

According to a third aspect of the present invention, there is provided an amplifier comprising: a first transistor and a second transistor each comprising a collector connected to a respective power source terminal, and each receiving an input signal from a respective base; a third transistor comprising a collector connected to an emitter terminal of the first transistor and a fourth transistor comprising a collector connected to an emitter terminal of the second transistor, the collector of the third transistor being cross-coupled to a base of the fourth transistor, and the collector of the fourth transistor being cross-coupled to a base of the third transistor; a fifth transistor for acquiring a current signal from a collector of the fifth transistor, the fifth transistor and the third transistor sharing the base and an emitter: and a sixth transistor for acquiring a current signal from a collector of the sixth transistor, the sixth transistor and the fourth transistor sharing the base and an emitter. A resistor is located between the emitters of the fifth transistor and the sixth transistor. A negative feedback resistor is added each between an emitter terminal of the fifth transistor and a ground, and between an emitter terminal of the sixth transistor and the ground, and an output load resistor is connected to each collector terminal of the fifth transistor and the sixth transistor. At least one of the first to sixth transistors comprises parallel connections comprising two or more transistors. The number of parallel connections of the first to sixth transistors has an arbitrary ratio, setting such an arbitrary ratio adjusting the amount of signal currents flowing through the fifth transistor and the sixth transistor relative to the entire amount of current.

This invention provides an amplifier that realizes lower power consumption and low-distortion operation, compared with conventional amplifiers. In addition, the operation margin is increased.

According to a fourth aspect of the present invention, there is provided a mixer circuit comprising: a frequency conversion circuit for generating, from a first signal and a second signal, a third signal as a product; and a transconductance stage (or gm stage) for receiving the first signal and carrying out voltage-current conversion of the first signal. The transconductance stage (or gm stage) comprises: a first transistor and a second transistor each comprising a collector connected to a respective power source terminal, and each receiving an input signal from a respective base; a third transistor comprising a collector connected to an emitter terminal of the first transistor and a fourth transistor comprising a collector connected to an emitter terminal of the second transistor, the collector of the third transistor being cross-coupled to a base of the fourth transistor, and the collector of the fourth transistor being cross-coupled to a base of the third transistor; a fifth transistor for acquiring a current signal from a collector of the fifth transistor, the fifth transistor and the third transistor sharing the base and an emitter: and a sixth transistor for acquiring a current signal from a collector of the sixth transistor, the sixth transistor and the fourth transistor sharing the base and an emitter. A resistor is provided between the emitters of the fifth transistor and the sixth transistor, and a current source is added to an emitter terminal of each of the fifth transistor and the sixth transistor.

This invention provides a mixer with improved distortion characteristics.

According to a fifth aspect of the present invention, there is provided a mixer circuit comprising: a frequency conversion circuit for generating, from a first signal and a second signal, a third signal as a product; and a transconductance stage (or gm stage) for receiving the first signal and carrying out voltage-current conversion of the first signal. The transconductance stage (or gm stage) comprises: a first transistor and a second transistor each comprising a collector connected to a respective power source terminal, and each receiving an input signal from a respective base; a third transistor comprising a collector connected to an emitter terminal of the first transistor and a fourth transistor comprising a collector connected to an emitter terminal of the second transistor, the collector of the third transistor being cross-coupled to a base of the fourth transistor, and the collector of the fourth transistor being cross-coupled to a base of the third transistor; a fifth transistor for acquiring a current signal from a collector of the fifth transistor, the fifth transistor and the third transistor sharing the base and an emitter: and a sixth transistor for acquiring a current signal from a collector of the sixth transistor, the sixth transistor and the fourth transistor sharing the base and an emitter. A resistor is located between the emitters of the fifth transistor and the sixth transistor, and a negative feedback resistor is added each between an emitter terminal of the fifth transistor and the ground, and between an emitter terminal of the sixth transistor and the ground.

This invention provides a mixer with improved distortion characteristics. In addition, the operation margin is increased, providing for improved performance.

According to a sixth aspect of the present invention, there is provided a quadrature mixer circuit comprising: a first frequency conversion circuit for generating, from a first signal and a second signal, a third signal as a product; a second frequency conversion circuit for generating, from the first signal and a fourth signal, a fifth signal as a product, wherein a transconductance stage (or gm stage) for inputting the first signal is shared. The transconductance stage (or gm stage) for receiving the first signal and carrying out voltage-current conversion of the first signal comprises: a first transistor and a second transistor each comprising a collector connected to a respective power source terminal, and each receiving an input signal from a respective base; a third transistor comprising a collector connected to an emitter terminal of the first transistor and a fourth transistor comprising a collector connected to an emitter terminal of the second transistor, the collector of the third transistor being cross-coupled to a base of the fourth transistor, and the collector of the fourth transistor being cross-coupled to a base of the third transistor; a fifth transistor for acquiring a current signal from a collector of the fifth transistor, the fifth transistor and the third transistor sharing the base and an emitter: and a sixth transistor for acquiring a current signal from a collector of the sixth transistor, the sixth transistor and the fourth transistor sharing the base and an emitter. A resistor is provided between the emitters of the fifth transistor and the sixth transistor, and a current source is added to an emitter terminal of each of the fifth transistor and the sixth transistor.

This invention provides a quadrature mixer circuit that realizes lower power consumption and low-distortion operation, compared with conventional quadrature mixer circuits.

According to a seventh aspect of the present invention, there is provided a quadrature mixer circuit comprising: a first frequency conversion circuit for generating, from a first signal and a second signal, a third signal as a product; a second frequency conversion circuit for generating, from the first signal and a fourth signal, a fifth signal as a product, wherein a transconductance stage (or gm stage) for inputting the first signal is shared. The transconductance stage (or gm stage) for receiving the first signal and carrying out voltage-current conversion of the first signal comprises: a first transistor and a second transistor each comprising a collector connected to a respective power source terminal, and each receiving an input signal from a respective base; a third transistor comprising a collector connected to an emitter terminal of the first transistor and a fourth transistor comprising a collector connected to an emitter terminal of the second transistor, the collector of the third transistor being cross-coupled to a base of the fourth transistor, and the collector of the fourth transistor being cross-coupled to a base of the third transistor; a fifth transistor for acquiring a current signal from a collector of the fifth transistor, the fifth transistor and the third transistor sharing the base and an emitter: and a sixth transistor for acquiring a current signal from a collector of the sixth transistor, the sixth transistor and the fourth transistor sharing the base and an emitter. A resistor is located between the emitters of the fifth transistor and the sixth transistor, and a negative feedback resistor is added each between an emitter terminal of the fifth transistor and the ground, and between an emitter terminal of the sixth transistor and the ground.

Preferably in the above mixer, at least one of the first to sixth transistors comprises parallel connections comprising two or more transistors, and the number of parallel connections of the first to sixth transistors has an arbitrary ratio, setting such an arbitrary ratio adjusting the amount of signal currents flowing through the fifth transistor and the sixth transistor relative to the entire amount of current. The parallely connected transistors of each of the first to sixth transistors comprise equal voltages between respective bases and emitters. The number of parallel connections of the first transistor and the number of parallel connections of the third transistor are equal, and the number of parallel connections of the second transistor and the number of parallel connections of the fourth transistor are equal.

This structure provides a mixer that has the characteristics described in relation to the voltage-current conversion circuit and realizes low power consumption and low-distortion operation.

In a more preferred embodiment of the present invention, in the above mixer, a bias is inputted into a base terminal of the first transistor and into a base terminal of the second transistor via two resistors, and the first transistor and the second transistor each receive an input signal via a capacitor.

This structure provides a mixer of differential input that keeps bias DC voltage uniform, as well as realizing low power consumption and low-distortion operation.

In a preferred embodiment of the present invention, a bias is inputted into a base terminal of the first transistor and into a base terminal of the second transistor via two resistors, one of the first transistor and the second transistor being grounded via a capacitor, while the other transistor receiving an input signal via a capacitor. Further, a bias is inputted into a base terminal of the first transistor or into a base terminal of the second transistor via two resistors, one of the first transistor and the second transistor being supplied with the bias alone, while the other transistor receiving an input signal via a capacitor.

This structure provides a mixer of single input that realizes low power consumption and low-distortion operation.

Preferably in the above voltage-current conversion circuit, amplifier, or mixer circuit, a current path is connected to the collector terminal of the fifth transistor and the sixth transistor.

With this structure, excessive current flowing through the switching portion is made to diverge (pulled out) while feeding sufficient current into the transconductance stage (or gm stage) by adjustment of the current mirror ratio. Thus, the transconductance stage (or gm stage) and the switching portion are optimized independently. This advantageous effect is most effective for circuits including mixers.

According to an eighth aspect of the present invention, there is provided a voltage-current conversion circuit comprising a transconductance stage (or gm stage) for carrying out voltage-current conversion, the transconductance stage (or gm stage) comprising: a first transistor and a second transistor each comprising a collector connected to a respective power source terminal, and each receiving an input signal from a respective base; a third transistor comprising a collector connected to an emitter terminal of the first transistor and a fourth transistor comprising a collector connected to an emitter terminal of the second transistor, the collector of the third transistor being cross-coupled to a base of the fourth transistor, and the collector of the fourth transistor being cross-coupled to a base of the third transistor; and a fifth transistor and the third transistor sharing the base and an emitter, and a sixth transistor and the third transistor sharing the base and an emitter, the fifth transistor and the sixth transistor each comprising parallel connections comprising a plurality of transistors connected in parallel. A resistor is provided between the emitters of the fifth transistor and the sixth transistor. The fifth transistor and the sixth transistor each comprise switching transistors connected to respective collectors, the number of the switching transistors being equal to the number of the parallel connections of each transistor, the switching transistors being controlled to adjust the amount of an output signal current relative to the entire current amount.

This structure enables it to externally control the current distribution ratio, realizing adjustments including making gain variable.

In a preferred embodiment of the present invention, a current source is added each between an emitter terminal of the fifth transistor and the ground, and between an emitter terminal of the sixth transistor and the ground.

This structure enables it to externally control the current distribution ratio and keep the operation current uniform.

In a preferred embodiment of the present invention, a negative feedback resistor is added each between the emitter terminal of the fifth transistor and the ground, and between an emitter terminal of the sixth transistor and the ground.

This structure enables it to externally control the current distribution ratio and increases the operation margin.

According to a ninth aspect of the present invention, there is provided a mobile appliance using an LSI comprising the above voltage-current conversion circuit, amplifier, or mixer circuit.

This invention finds applications in the voltage-current conversion portions of various blocks required for receiver LSIs, thus contributing to the low power consumption of mobile terminals.

The present invention realizes the following advantageous effects. The voltage-current conversion circuit of the present invention and mixer circuits using the circuit have improved freedom of design, realizing arbitrary setting of the current distribution in the transconductor. In addition, by adjusting the distributions in the current mirror ratio, low power consumption is realized. Further, the use of a current path enables optimum design of the transconductor and switching portion independently while maintaining low-distortion amplification operation. Furthermore, the current distribution ratio can be externally controlled.

DESCRIPTION OF THE PREFERRED EMBODIMENTS

In respect to a transconductance stage (or gm stage) with first to sixth transistors aimed at low-distortion, the present inventors have reduced power consumption by adjustment for the optimum operation current. This has been accomplished by setting of the ratio of the number of parallel connections or the size ratio of the first to sixth transistors. Embodiments of the present invention will be described referring to drawings.

Embodiment 1

A voltage-current conversion circuit according to embodiment 1 of the present invention will be described based on FIG. 1.

Figure 1:
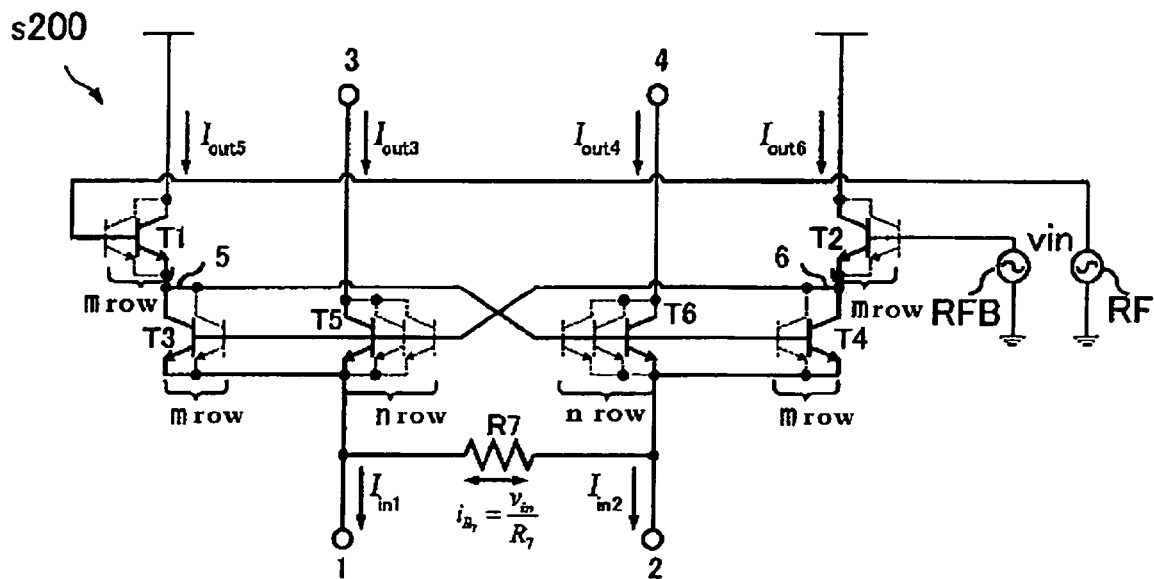
FIG. 1 is a view showing the concept of a voltage-current conversion circuit according to embodiment 1 of the present invention.
Figure 1:
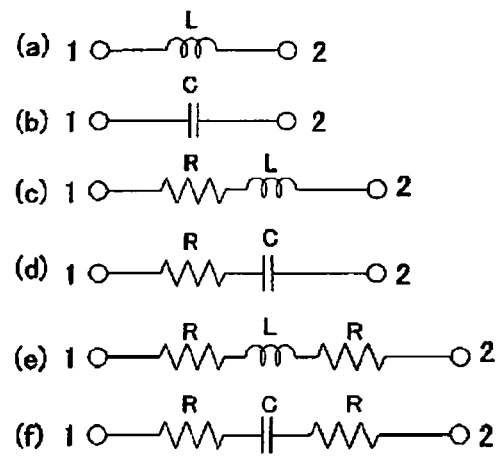

Referring to FIG. 1, transconductance stage (or gm stage) s200 of embodiment 1 that carries out voltage-current conversion has first transistor T1 and second transistor T2. Each of the transistors has a collector connected to a respective power source terminal, and receives an input signal from a respective base. Transconductance stage (or gm stage) s200 also has third transistor T3 having its collector connected to the emitter terminal of first transistor T1, and fourth transistor T4 having its collector connected to the emitter terminal of second transistor T2. The collector of third transistor T3 is cross-coupled to the base of fourth transistor T4, and the collector of fourth transistor T4 is cross-coupled to the base of third transistor T3. Transconductance stage (or gm stage) s200 also has fifth transistor T5 that shares its base and emitter with third transistor T3 and acquires a current signal from the collector, and sixth transistor T6 that shares its base and emitter with fourth transistor T4 and acquires a current signal from the collector. Resistor R7 is located between the emitters of the fifth and sixth transistors. Transistors T1, T2, T3, and T4 each have an m-row of parallel connections of transistors. Transistors T5 and T6 each have an n-row of parallel connections of transistors.

This structure forms a current mirror between transistor T3 and transistor T5 (transistor T4 and transistor T6), and the reference current is distributed in a ratio of m:n.

According to this embodiment, a new parameter, which is the ratio of the number of parallel connections, is introduced while maintaining the conventionally proposed low-distortion amplification operation. This relaxes a design of gm stages. Further, the current distributions for the fifth and sixth transistors are optimized (improvement of gm). Generally, gm increases in proportion to an increase in the operation current. By controlling the operation current by the ratio of the number of parallel connections of the transistors (the current mirror ratio), the operation current is utilized effectively, providing for low power consumption.

While this embodiment describes a change in the ratio of the number of parallel connections, the ratio of the sizes of the transistors may be arbitrarily set in order to adjust the amount of the signal currents flowing through fifth transistor T5 and sixth transistor T6 relative to the entire amount of current.

In the voltage-current conversion circuit of embodiment 1, negative feedback resistor R7 shown in FIG. 1 may be replaced with another impedance element. The resistor connected between nodes 1 and 2 may be substituted with an inductor (a) or a capacitor (b), as shown in the lower half of the figure. This is for the purpose of noise reduction, taking into account frequency variations of gain and linearity, which depend greatly on the negative feedback resistor. The other alternatives (c) to (f) shown in the figure are for the purpose of balancing the trade-off between noise and frequency variations. Alternatives (e) and (f) among these are designed for the outline symmetry of a differential pair.

Embodiment 2

A voltage-current conversion circuit according to embodiment 2 will be described based on FIG. 2. Like parts in the figures are denoted by like reference numbers.

Figure 2:
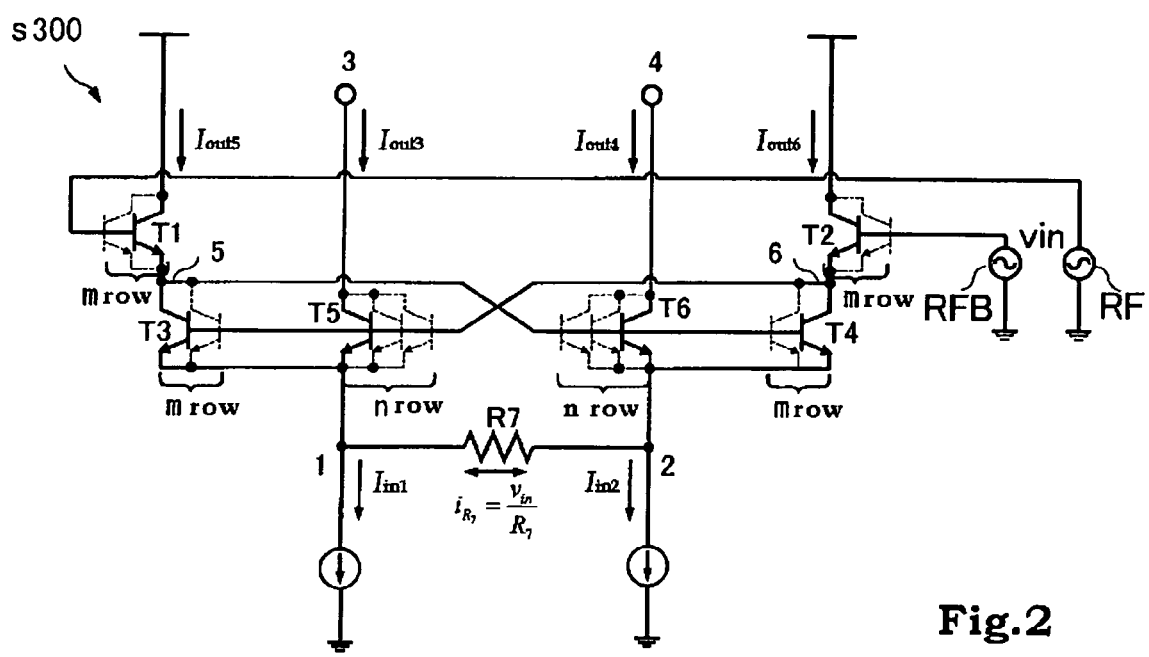
FIG. 2 is a view showing the concept of a voltage-current conversion circuit according to embodiment 2 of the present invention.
Figure 12:
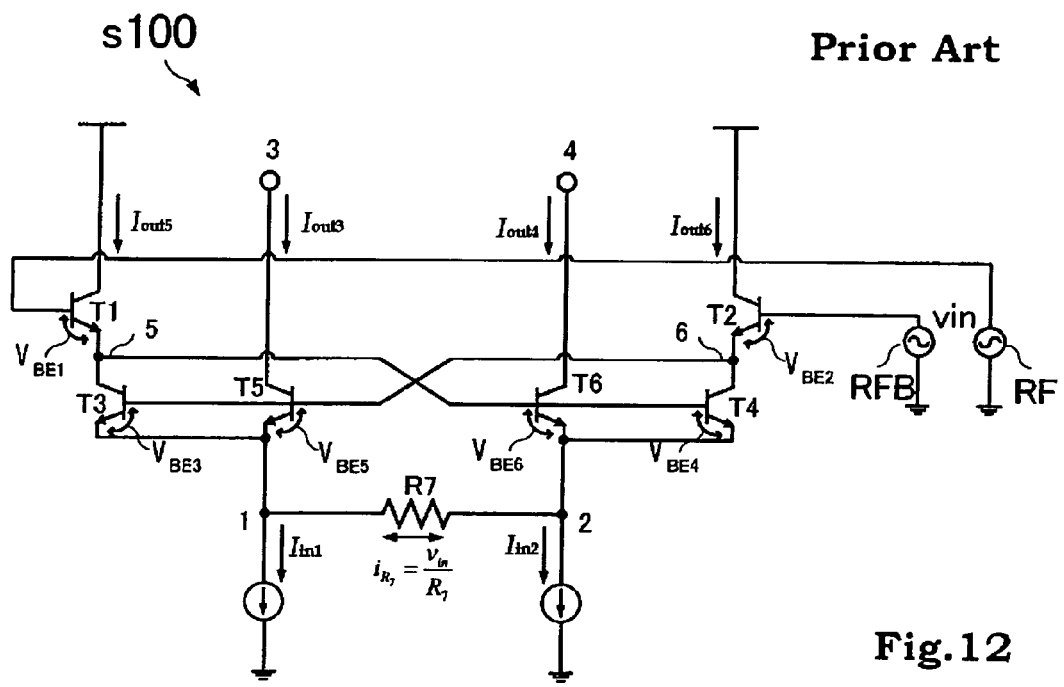
FIG. 12 is a view showing another conventional voltage-current conversion circuit with cross-coupling.
Figure 13:
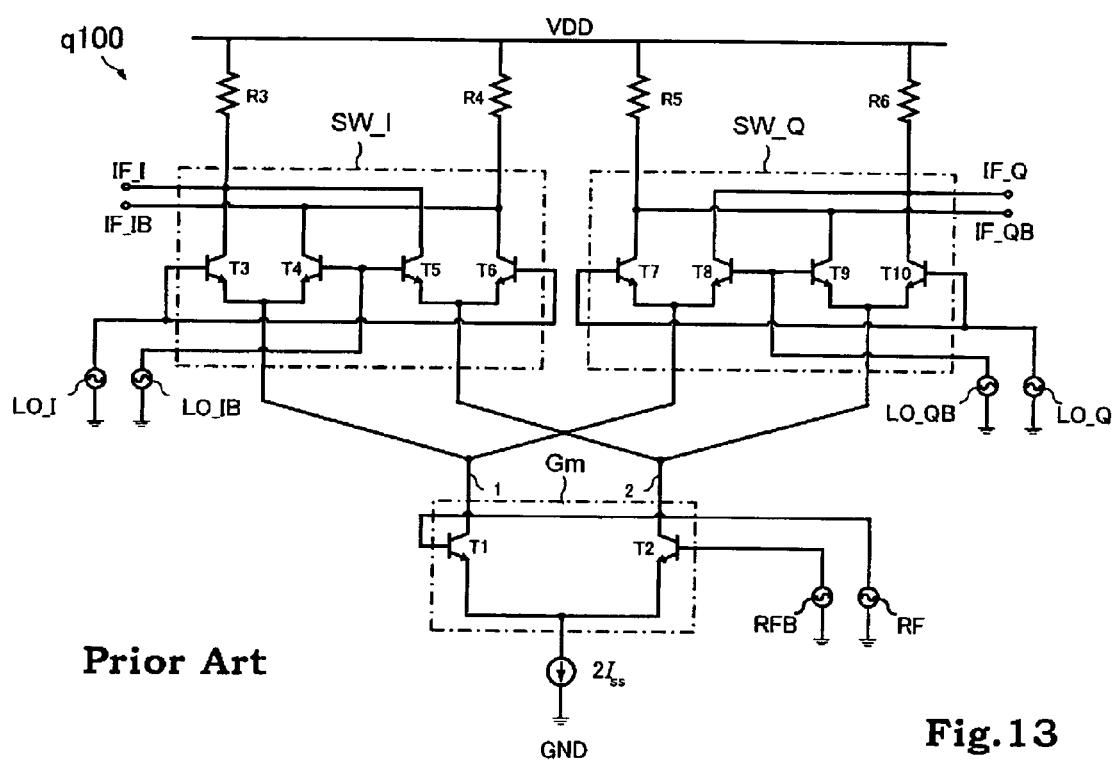
FIG. 13 is a circuit diagram of a conventional quadrature mixer.
Figure 14:
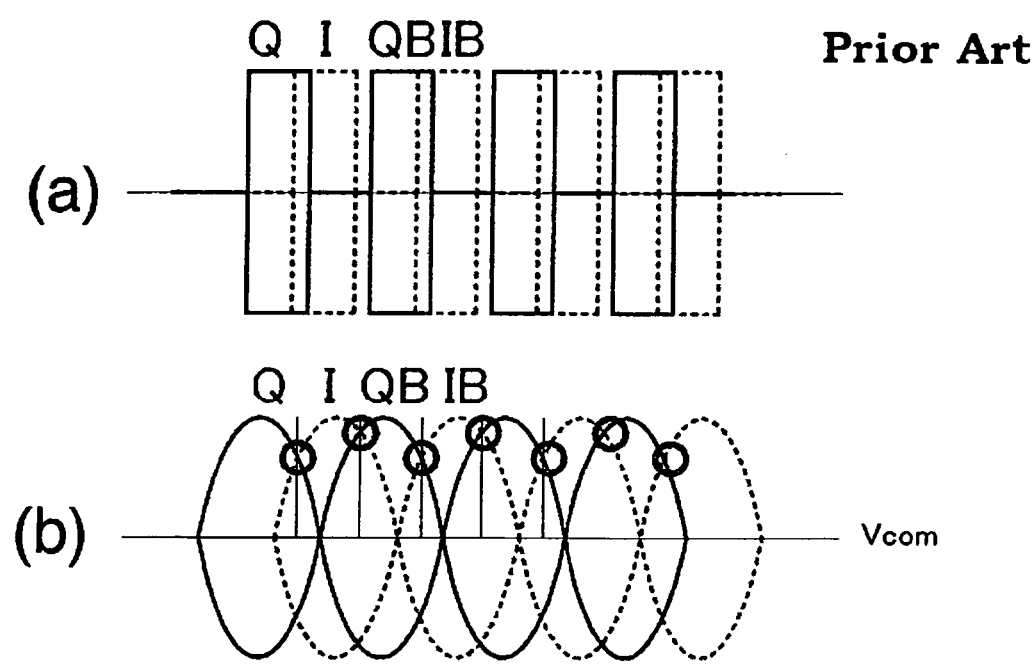
FIG. 14 is a conceptual view describing points of intersection that appear at constant intervals in a sine wave instead of a square wave.
Figure 15:
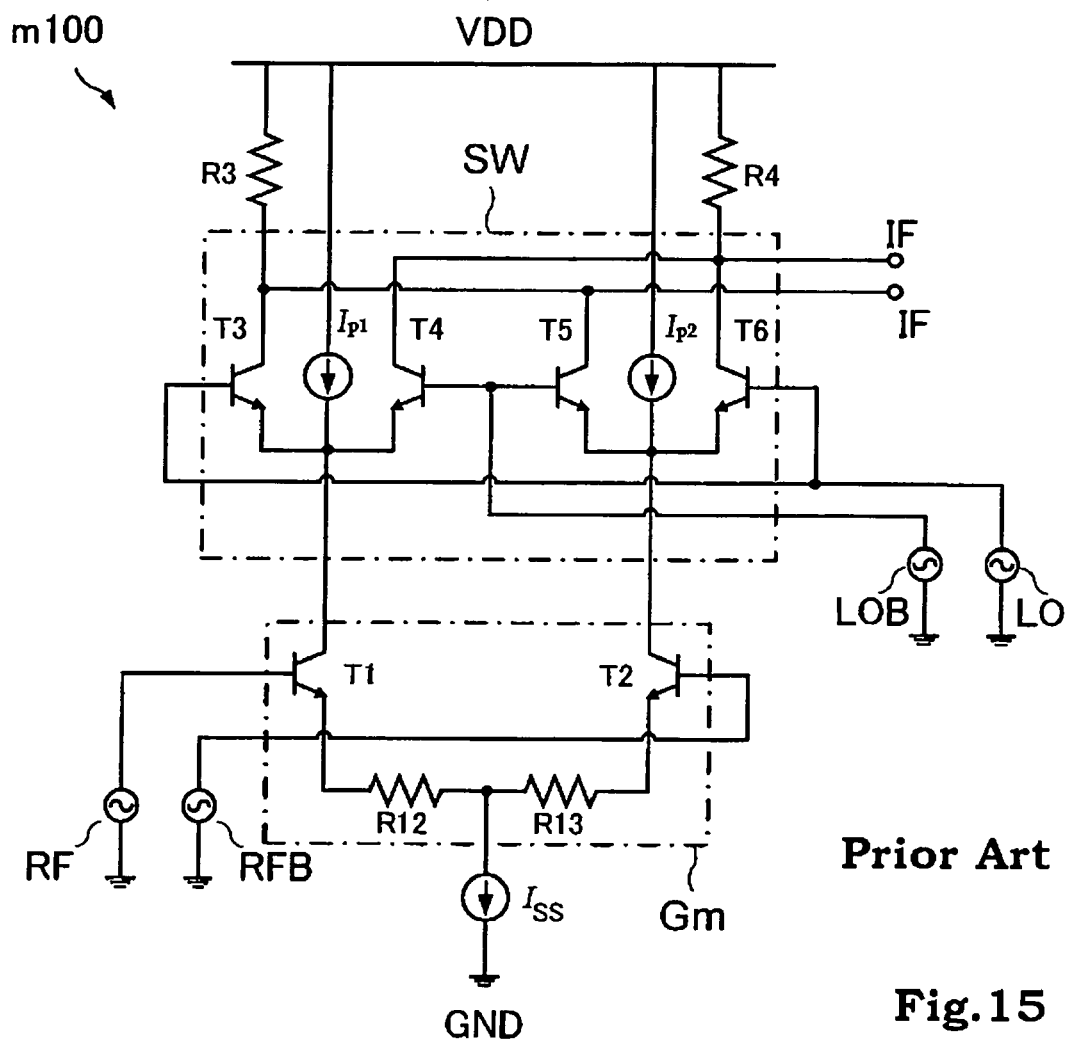
FIG. 15 is a circuit diagram of a conventional mixer with paths.

Referring to FIG. 2, in voltage-current conversion circuit s300 of embodiment 2, transistors T1, T2, T3, and T4 each have an m-row of parallel connections of transistors. Transistors T5 and T6 each have an n-row of parallel connections of transistors. The fifth transistor T5 and sixth transistor T6 each have a current source added to the emitter terminal of each transistor. Having the ratio m:n=1:1 is equivalent to the conventional circuit shown in FIG. 12. This embodiment enables the same operation even when m:n ≠1:1. For example, when T3:T5=T4:T6=m:n (while T1:T3=T2:T4=1:1), above-described formulas (5) to (7) are true. The output currents are represented by formulas (11) and (12) shown below, with constant current $I_{ss}$ being the reference current.

[Mathematical Formula VII]

$$I^*_{out3} = \frac{n}{(m+n)}\left(I_{SS} - \frac{v_{in}}{R_7}\right) \quad (11)$$

$$I^*_{out4} = \frac{n}{(m+n)}\left(I_{SS} + \frac{v_{in}}{R_7}\right) \quad (12)$$

Transconduntances gm3* and gm4* in this case are represented by formula (13) shown below.

[Mathematical Formula VIII]

$$gm3^* = gm4^* = \frac{n}{(m+n)} \cdot \frac{1}{R_7} \quad (13)$$

For reference, the currents flowing through nodes 5 and 6 are represented by formulas (14) and (15) shown below.

[Mathematical Formula IX]

$$I^*_{out5} = \frac{n}{(m+n)}\left(I_{SS} - \frac{v_{in}}{R_7}\right) \quad (14)$$

$$I^*_{out6} = \frac{n}{(m+n)}\left(I_{SS} + \frac{v_{in}}{R_7}\right) \quad (15)$$

According to this embodiment, the current ratio can be set arbitrarily with the number of parallel connections as the parameter, as seen from formulas (11), (12), (13), and (14). It should be noted, however, that the relationship T1:T3=T2:T4=1:1 is essential since equal currents flow through T1 and T3 (T2 and T4).

Under the special condition m:n=1:1, formulas (11) and (12) are respectively equal to formulas (8) and (9). As a general method of improving gm, having the relationship n>m is considered preferable in terms of increasing the current distributions for transistors T5 and T6. This reduces excessive current distributions for the m-row transistors, providing for low-power consumption. It will be appreciated, however, that the present invention is not limited to the condition n>m.

Embodiment 3

A voltage-current conversion circuit of embodiment 3 will be described based on FIG. 3.

Figure 3:
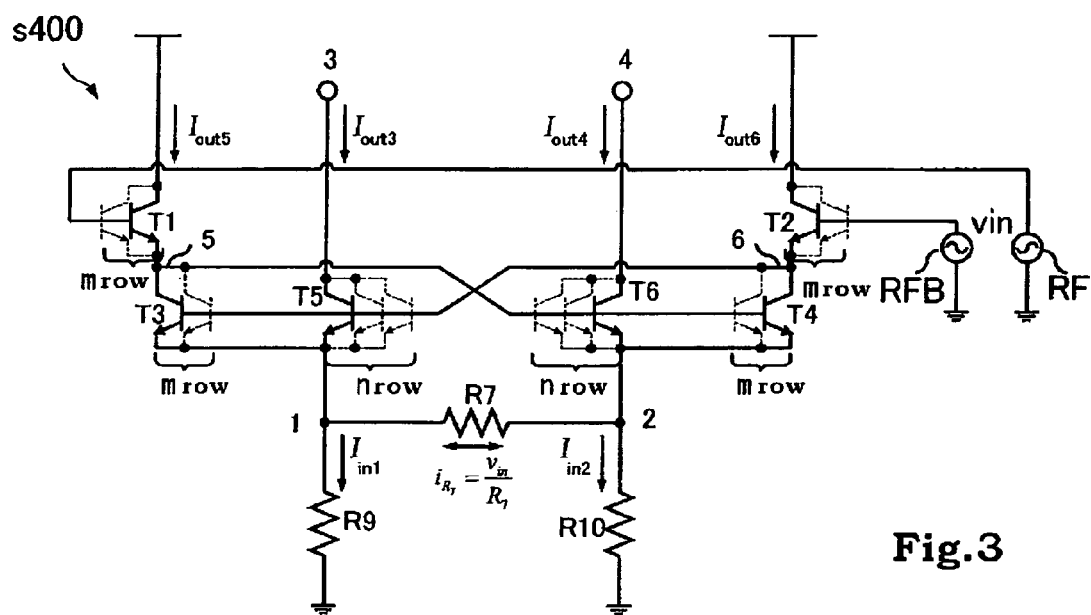
FIG. 3 is a view showing the concept of a voltage-current conversion circuit according to embodiment 3 of the present invention.

Referring to FIG. 3, voltage-current conversion circuit s400 of embodiment 3 has negative feedback resistors R9 and R10 instead of current sources. Transistors T3 to T6 double as current source transistors. The operation current depends on the DC biases in transistors T1 and T2. This structure increases the operation margin, providing for improvement of performance.

Figure 4:
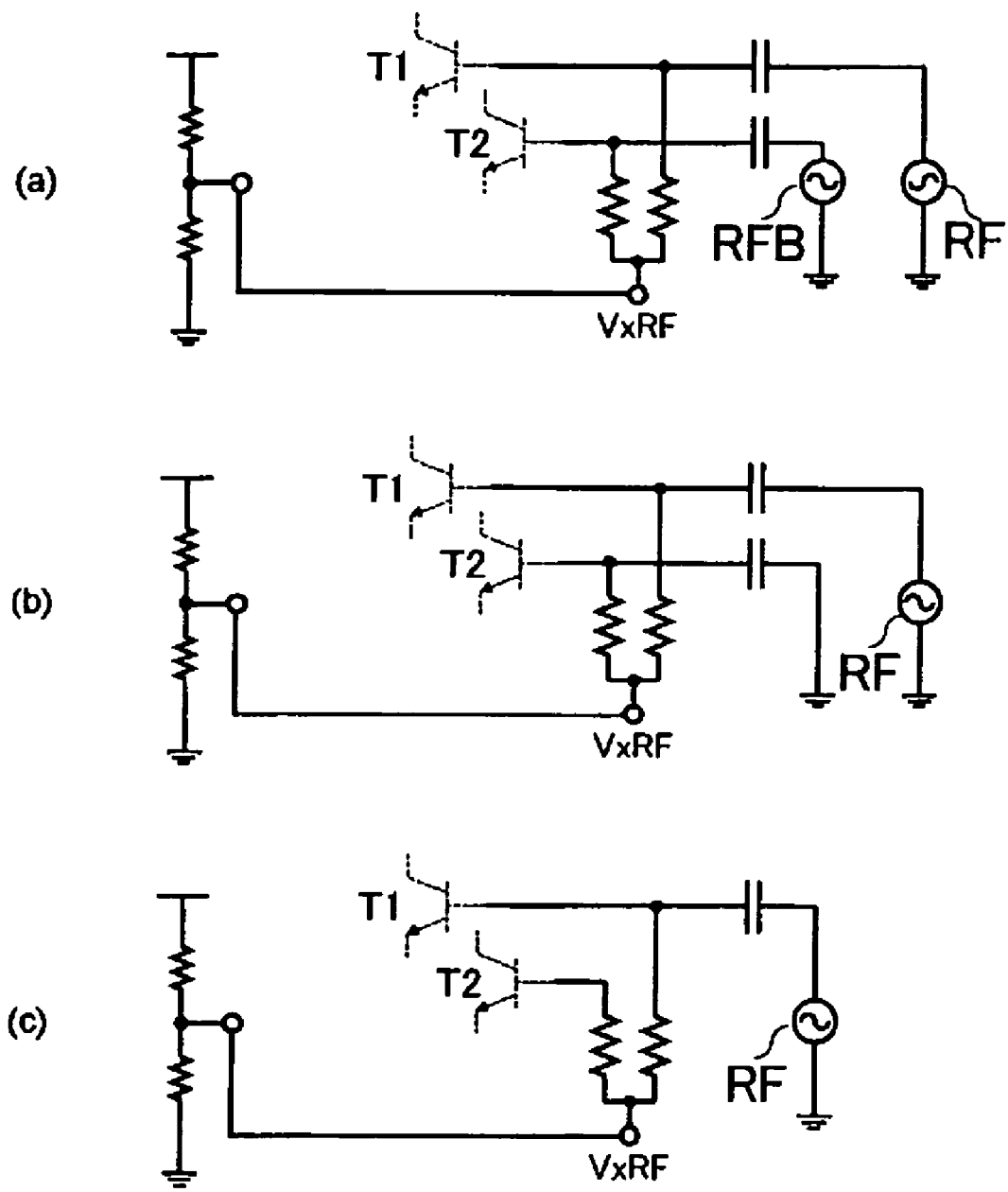
FIG. 4 is a view showing the differences between differential input and single input.

FIG. 4 shows the structures of the signal input portions of the voltage-current conversion circuits of embodiments 1 to 3. As shown in FIG. 4(a), in the case of differential input, each transistor is DC biased via two resistors, and an AC signal is inputted into each transistor via a capacitor. A reference voltage terminal composed of a resistive bias-generation circuit which is connected to the VxRF terminal. In the case of a mixer circuit, detailed later, LO signal is inputted in a like manner.

As shown in FIG. 4(b), in the case of single input, the input terminal (transistor T2) that does not receive a signal is connected to GND via a capacitor. Alternatively, as shown in FIG. 4(c), the input terminal (transistor T2) that does not receive a signal may be supplied only with DC bias. This enables single-differential conversion. In addition, as shown in FIGS. 1 to 3, the cross-coupling structure reduces deterioration of performance caused by single input.

Embodiment 4

Figure 5:
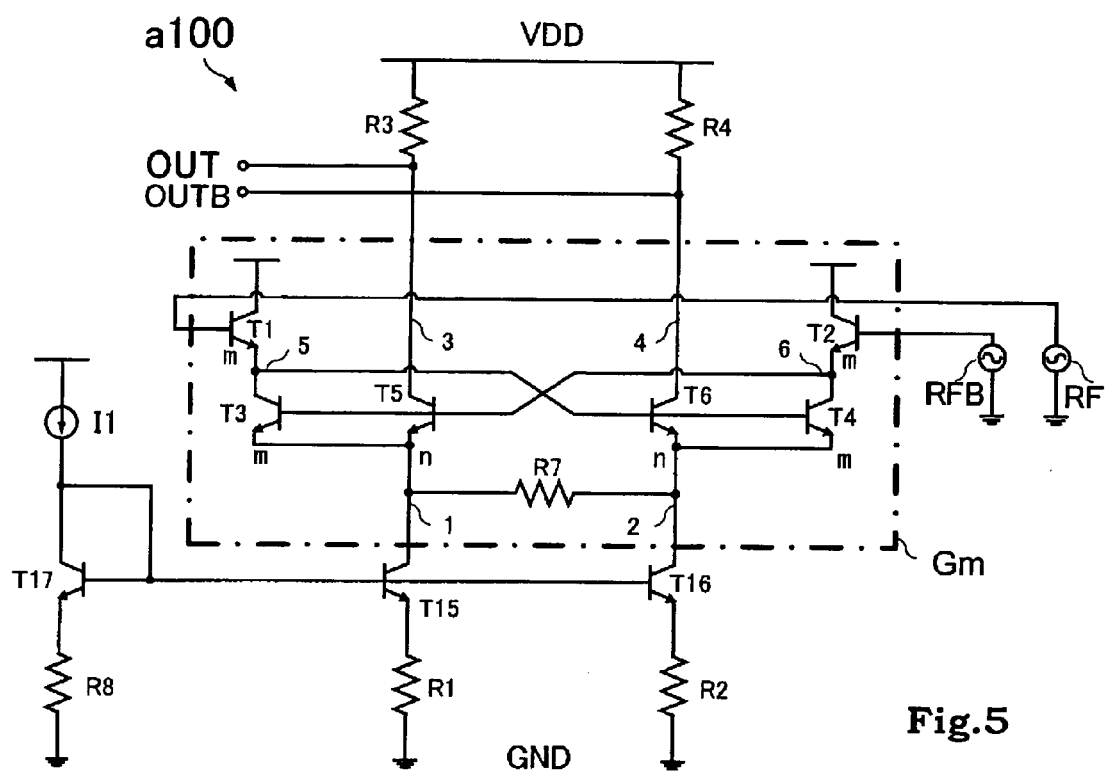
FIG. 5 is a view showing a specific example of an amplifier according to embodiment 4 of the present invention.

FIG. 5 is a circuit diagram of an amplifier of embodiment 4 of the present invention. Like parts in FIGS. 2 and 5 are denoted by like reference numbers, and descriptions thereof will not be elaborated upon here. Embodiment 4 is an application of the voltage-current conversion circuit of embodiment 2 to amplifier a100. This is realized by connecting output load resistors R3 and R4 respectively to the collector terminals of fifth and sixth transistors T5 and T6. The constant current source includes current source Il, transistors T15, T16, and T17, and negative feedback resistors R1, R2, and R8 for enhancing current source stability.

According to this embodiment, by arbitrarily setting the ratio of the number (m, n) of parallel connections of the transistors, the amount of the signal currents flowing through fifth transistor T5 and sixth transistor T6 relative to the entire amount of current is adjusted, enabling the setting of the optimum currents for transistors T5 and T6. This increases freedom of design and reduces power consumption. In this embodiment, instead of using transistors that double as current sources as shown in FIG. 5, connection to ground via a negative feedback resistor as in FIG. 3 increases the operation margin, though such a structure is not shown in this embodiment.

Embodiment 5

Figure 6:
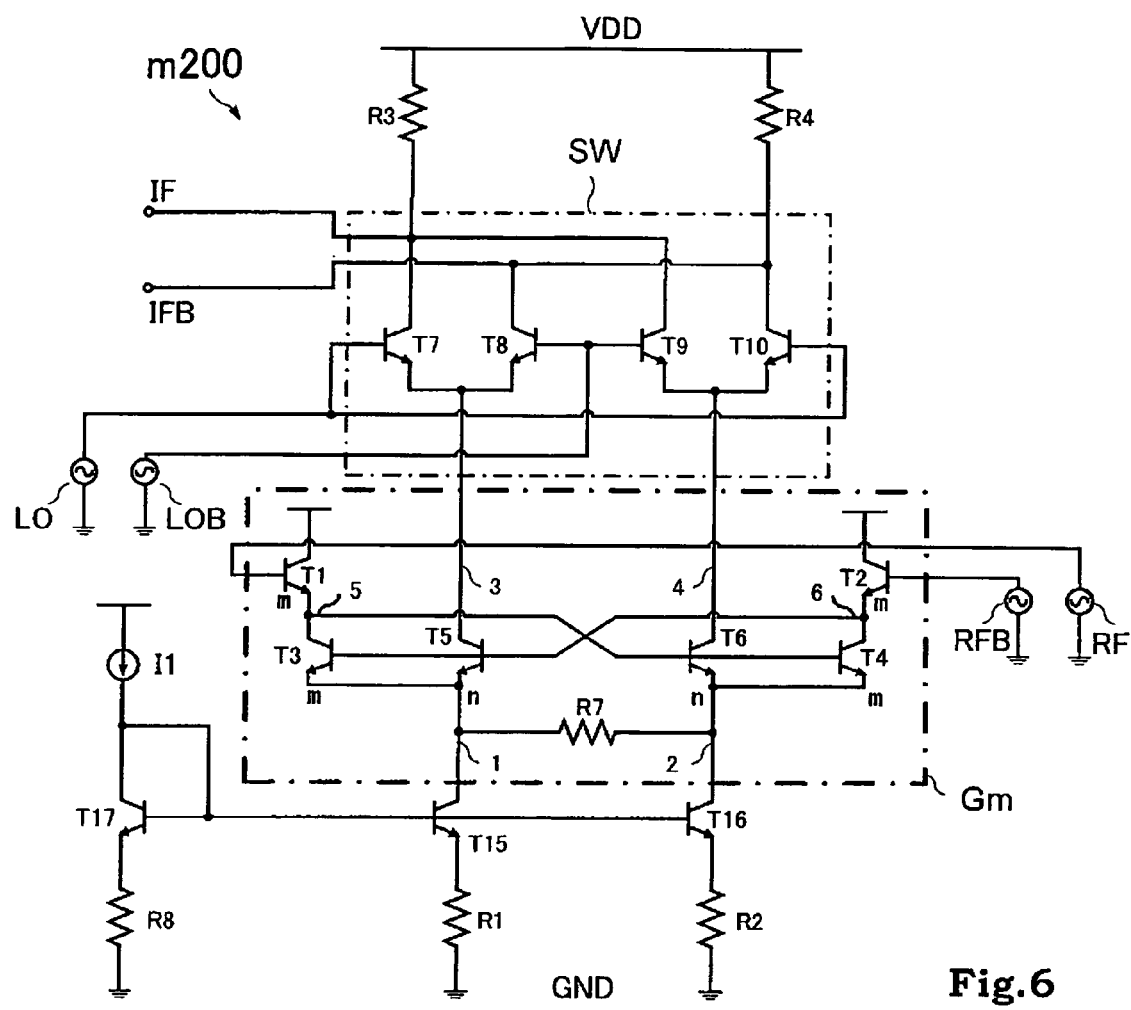
FIG. 6 is a circuit diagram of a mixer according to embodiment 5 of the present invention.

FIG. 6 is a circuit diagram of a mixer of embodiment 5 having the above-described voltage-current conversion circuit applied thereto. Mixer circuit m200 has: switching circuit SW that is a frequency conversion circuit for generating, from a first signal (RF, RFB) and a second signal (LO, LOB), a third signal (IF, IFB) as the product; and transconductance stage (or gm stage) Gm.

As in the amplifier of embodiment 4, by arbitrarily setting the ratio of the number (m, n) of parallel connections of the transistors, the amount of the signal currents flowing through fifth transistor T5 and sixth transistor T6 relative to the entire amount of current is adjusted. This increases freedom of design and reduces power consumption.

It is noted that the circuit corresponding to claim 11 is obtained when m:n=1:1.

Embodiment 6

Figure 7:
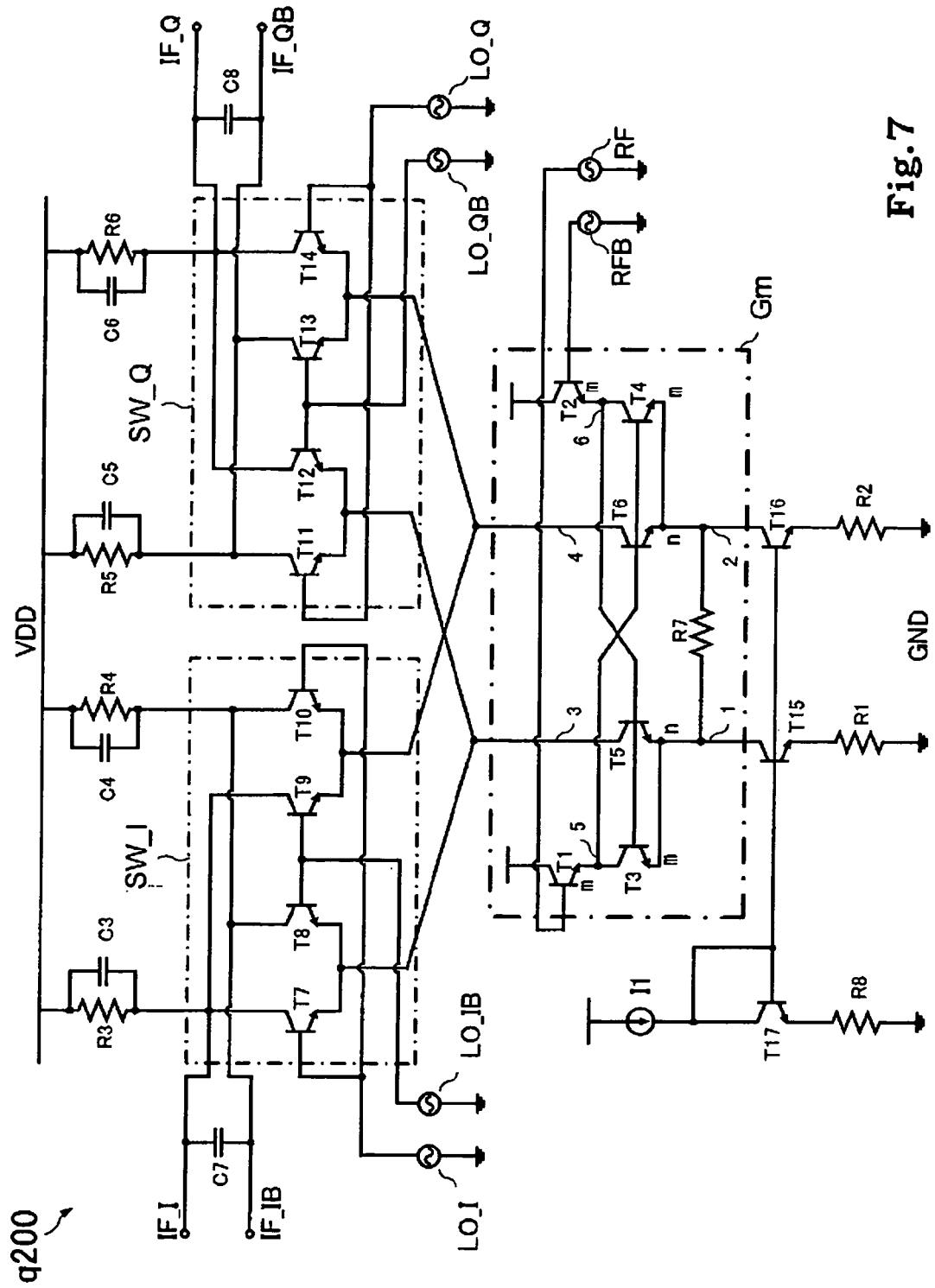
FIG. 7 is a circuit diagram of a mixer according to embodiment 6 of the present invention.

FIG. 7 is a circuit diagram of a quadrature mixer of embodiment 6 having the above-described voltage-current conversion circuit applied thereto.

Quadrature mixer q200 has: first switching circuit SW_I for generating, from a first signal (RF, RFB) and a second signal (LO, LOB), a third signal (IF_I, IF_IB) as the product; second switching circuit SW_Q for generating, from a first signal (RF, RFB) and a fourth signal (LO_Q, LO_QB), a fifth signal (IF_Q, IF_IQ) as the product; and common transconductance stage (or gm stage) Gm for amplifying a signal and inputting the amplified signal into first switching circuit SW_I and second switching circuit SW_Q. Quadrature mixer q200 also has capacitors C3 to C8.

With this embodiment, by arbitrarily setting the ratio of the number (m, n) of parallel connections of the transistors, the amount of the signal currents flowing through fifth transistor T5 and sixth transistor T6 relative to the entire amount of current is adjusted. This increases freedom of design and reduces power consumption, as in embodiments 2 and 3. In addition, the characteristic effects of the quadrature mixer such as compression of output phase error realized by IQ interaction, a reduction by half in power consumption realized by having a common inputting portion, and a reduction in the number of elements, combine with the advantageous effects of the present invention such as low distortion and a further reduction in power consumption. The combination provides for multiplier effects. Further, insertion of capacitors C3 to C6 improves common mode noise resistance, and insertion of capacitors C7 and C8 attenuates unnecessary higher harmonics.

It is noted that the circuit corresponding to claim 13 is obtained when m:n=1:1.

Embodiment 7

Figure 8:
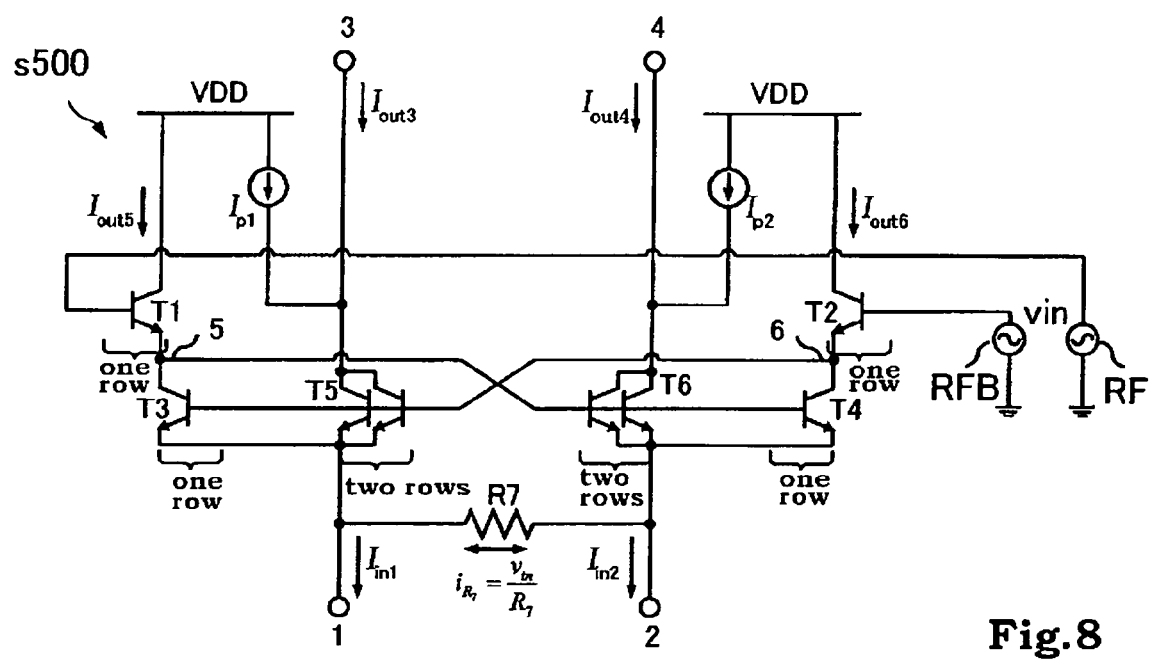
FIG. 8 is a view showing a specific example of a voltage-current conversion circuit according to embodiment 7 of the present invention.

FIG. 8 is a circuit diagram of transconductance stage (or gm stage) s500 of embodiment 7. A feature of this embodiment is that current path $I_{p1}$ or $I_{p2}$ is connected to the collector terminal of fifth transistor T5 or sixth transistor T6. If this structure is combined with a switching circuit (not shown) that carries out frequency conversion, a mixer results. In this case, the connective embodiment of the transconductance stage (or gm stage) and switching circuit is as shown in FIG. 6 or 7.

When the present embodiment is applied in a mixer, the following advantageous effect is realized. Since current path $I_{p1}$ or $I_{p2}$ is connected to the collector terminal of fifth transistor T5 or sixth transistor T6, when increasing the current distributions for transistors T5 and T6, excessive current is prevented from flowing into the switch stages of the mixers of embodiments 5 and 6 connected to terminals 3 and 4. For example, when m:n=1:2 as in FIG. 8, the output currents are as represented by formulas (16) and (17) shown below, using above-described formulas (11) and (12).

[Mathematical Formula X]

$$I^*_{out3} = \frac{2}{3}\left(I_{SS} - \frac{v_{in}}{R_7}\right) - I_{p1} \quad (16)$$

$$I^*_{out4} = \frac{2}{3}\left(I_{SS} + \frac{v_{in}}{R_7}\right) - I_{p2} \quad (17)$$

As seen from formulas (16) and (17), only transistors T5 and T6 are supplied with increased current distributions, and excessive currents ($I_{p1}$, $I_{p2}$) are subtracted by outputting.

Embodiment 8

Figure 9:
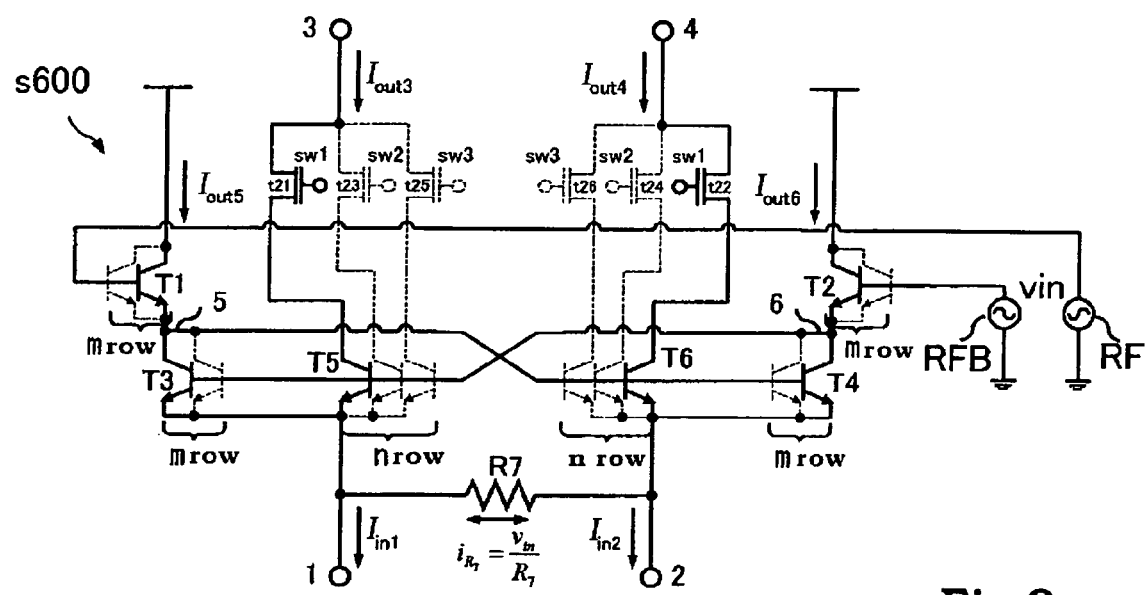
FIG. 9 is a view showing a specific example of a voltage-current conversion circuit according to embodiment 8 of the present invention.
Figure 10:
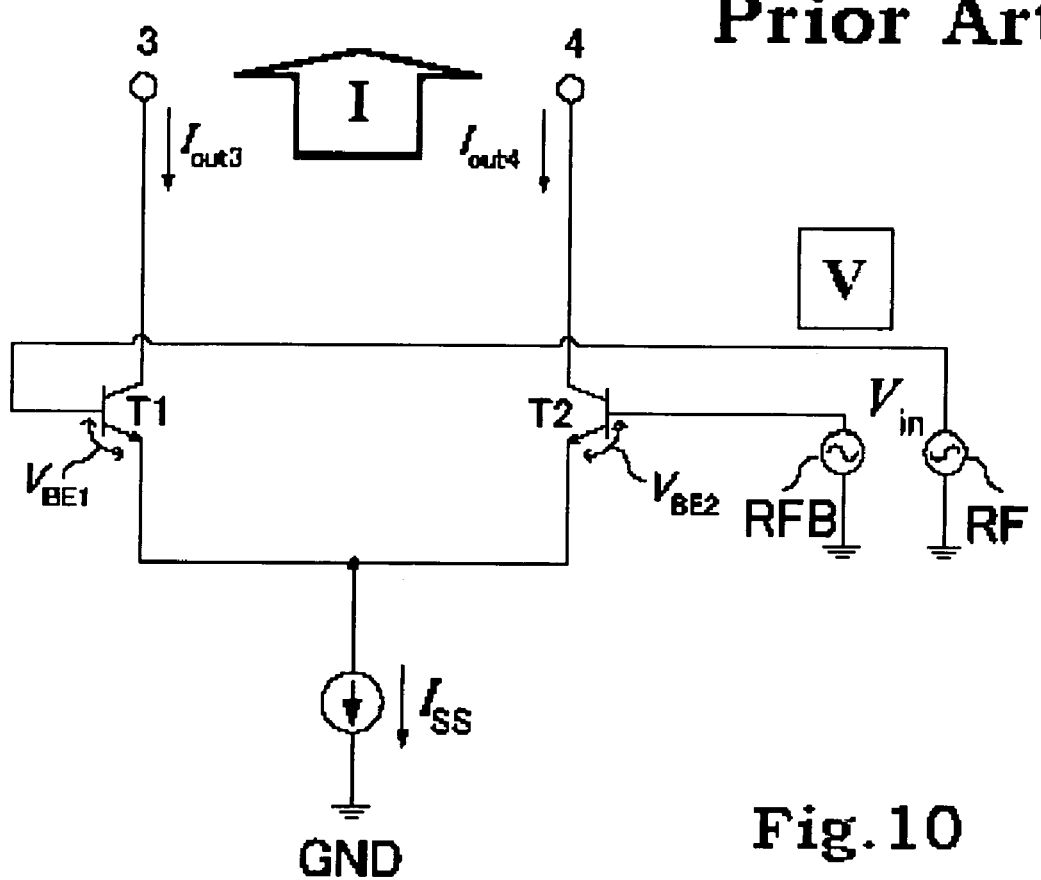
FIG. 10 is a view showing a conventional voltage-current conversion circuit.
Figure 11:
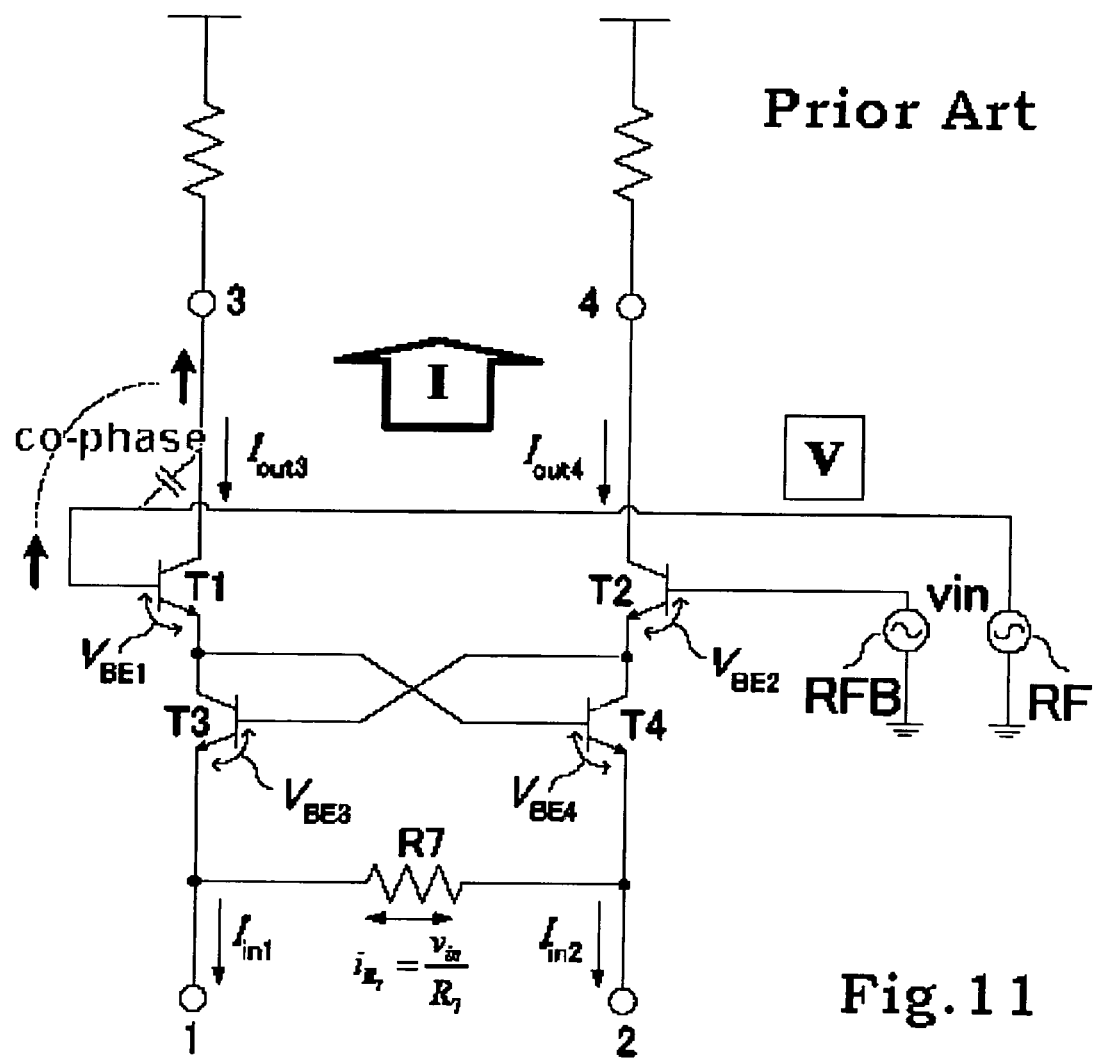
FIG. 11 is a view showing a conventional voltage-current conversion circuit with cross-coupling.

FIG. 9 is a circuit diagram of transconductance stage (or gm stage) s600 of embodiment 8. A feature of this embodiment is that fifth transistor T5 and sixth transistor T6 each have switching transistors SW1, SW2, and SW3, connected to respective collectors. The number of the switching transistors is equal to the number of the parallel connections of each transistor. If this structure is combined with a switching circuit (not shown) that carries out frequency conversion, a mixer results. In this case, the connective embodiment of the transconductance stage (or gm stage) and switching circuit is as shown in FIG. 6 or 7. By turning on SW1, SW2, and SW3 sequentially, the number of n-row transistors operable is determined. This structure enables external control of the m:n ratio. The current source is not particularly limited and may be as shown in FIG. 2 or 3.

A design carried out according to embodiment 8 had a reduction in power consumption by 20% from conventional designs while maintaining various performances.

While the present invention has been described taking bipolar transistors as examples, these examples are not to be restrictive. Also, two or more of the voltage-current conversion circuits shown in FIGS. 1, 2, 3, 8, and 9 may be conveniently combined to constitute an amplifier and a mixer circuit.

The embodiments herein described are to be considered in all respects as illustrative and not restrictive. The scope of the invention should be determined not by the embodiments illustrated, but by the appended claims, and all changes which come within the meaning and range of equivalency of the appended claims are therefore intended to be embraced therein.

What is claimed is:

1. A voltage-current conversion circuit comprising a transconductance stage for carrying out voltage-current conversion, the transconductance stage comprising:
    a first transistor and a second transistor each comprising a collector connected to a respective power source terminal, and each receiving an input signal from a respective base;
    a third transistor comprising a collector connected to an emitter terminal of the first transistor and a fourth transistor comprising a collector connected to an emitter terminal of the second transistor, the collector of the third transistor being cross-coupled to a base of the fourth transistor, and the collector of the fourth transistor being cross-connected to a base of the third transistor;
    a fifth transistor for acquiring a current signal from a collector of the fifth transistor, the fifth transistor and the third transistor sharing the base and an emitter: and
    a sixth transistor for acquiring a current signal from a collector of the sixth transistor, the sixth transistor and the fourth transistor sharing the base and an emitter, wherein:
    the first to fourth transistors each have an m-row of parallel connections of transistor elements;
    the fifth and sixth transistors each have an n-row of parallel connections of transistor elements;
    a resistor element is provided between the emitters of the fifth transistor and the sixth transistor; and
    a transconductance (gm) is determined by m, n, and resistances of the resistor element.

2. The voltage-current conversion circuit according to claim 1, wherein the fifth transistor and the sixth transistor each comprise a current source added between an emitter terminal of each transistor and the ground.

3. The voltage-current conversion circuit according to claim 1, wherein a negative feedback resistor is added each between an emitter terminal of the fifth transistor and the ground, and between an emitter terminal of the sixth transistor and the ground.

4. The voltage-current conversion circuit according to claim 1, wherein the parallely connected transistors each of the first to sixth transistors comprise equal voltages between respective bases and emitters.

5. The voltage-current conversion circuit according to claim 1, wherein the number of parallel connections of the first transistor and the number of parallel connections of the third transistor are equal, and the number of parallel connections of the second transistor and the number of parallel connections of the fourth transistor are equal.

6. The voltage-current conversion circuit according to claim 1, wherein:
a bias is inputted into a base terminal of the first transistor and into a base terminal of the second transistor via two resistors; and
the first transistor and the second transistor each receive an input signal via a capacitor.

7. The voltage-current conversion circuit according to claim 1, wherein:
a bias is inputted into a base terminal of the first transistor and into a base terminal of the second transistor via two resistors; and
one of the first transistor and the second transistor is grounded via a capacitor, and the other transistor receives an input signal via a capacitor.

8. The voltage-current conversion circuit according to claim 1, wherein a bias is inputted into a base terminal of the first transistor and into a base terminal of the second transistor via two resistors, one of the first transistor and the second transistor being supplied with the bias alone, while the other transistor receiving an input signal via a capacitor.

9. The voltage-current conversion circuit according to claim 1, wherein a current path is connected to a collector terminal of the fifth transistor or the sixth transistor.

10. An amplifier comprising:
a first transistor and a second transistor each comprising a collector connected to a respective power source terminal, and each receiving an input signal from a respective base;
a third transistor comprising a collector connected to an emitter terminal of the first transistor and a fourth transistor comprising a collector connected to an emitter terminal of the second transistor, the collector of the third transistor being cross-coupled to a base of the fourth transistor, and the collector of the fourth transistor being cross-coupled to a base of the third transistor;
a fifth transistor for acquiring a current signal from a collector of the fifth transistor, the fifth transistor and the third transistor sharing the base and an emitter; and
a sixth transistor for acquiring a current signal from a collector of the sixth transistor, the sixth transistor and the fourth transistor sharing the base and an emitter, wherein:
the first to fourth transistors each have an m-row of parallel connections of transistor elements;
the fifth and sixth transistors each have an n-row of parallel connections of transistor elements;
a resistor element is provided between the emitters of the fifth transistor and the sixth transistor, and a current source is added to an emitter terminal of each of the fifth transistor and the sixth transistor;
an output load resistor is connected to each collector terminal of the fifth transistor and the sixth transistor; and
a transconductance (gm) is determined by m, n, and resistances of the resistor element.

11. An amplifier comprising:
a first transistor and a second transistor each comprising a collector connected to a respective power source terminal, and each receiving an input signal from a respective base;
a third transistor comprising a collector connected to an emitter terminal of the first transistor and a fourth transistor comprising a collector connected to an emitter terminal of the second transistor, the collector of the third transistor being cross-coupled to a base of the fourth transistor, and the collector of the fourth transistor being cross-coupled to a base of the third transistor;
a fifth transistor for acquiring a current signal from a collector of the fifth transistor, the fifth transistor and the third transistor sharing the base and an emitter: and
a sixth transistor for acquiring a current signal from a collector of the sixth transistor, the sixth transistor and the fourth transistor sharing the base and an emitter, wherein:
the first to fourth transistors each have an m-row of parallel connections of transistor elements;
the fifth and sixth transistors each have an n-row of parallel connections of transistor elements;
a resistor element is provided between the emitters of the fifth transistor and the sixth transistor;
a negative feedback resistor is added each between an emitter terminal of the fifth transistor and the ground, and between an emitter terminal of the sixth transistor and the ground, and an output load resistor is connected to each collector terminal of the fifth transistor and the sixth transistor; and
a transconductance (gm) is determined by m, n, and resistances of the resistor element.

12. The amplifier according to claim 10 or 11, wherein a current path is connected to a collector terminal of the fifth transistor and the sixth transistor.

13. A mixer circuit comprising:
a transconductance stage for converting an input signal voltage to a current signal; and
a frequency conversion circuit connected to the transconductance stage and for converting the frequency of the current signal acquired from the transconductance stage, the transconductance stage comprising:
a first transistor and a second transistor each comprising a collector connected to a respective power source terminal, and each receiving said input signal voltage from a respective base;
a third transistor comprising a collector connected to an emitter terminal of the first transistor and a fourth transistor comprising a collector connected to an emitter terminal of the second transistor, the collector of the third transistor being cross-coupled to a base of the fourth transistor, and the collector of the fourth transistor being cross-coupled to a base of the third transistor;
a fifth transistor for acquiring a current signal from a collector of the fifth transistor, the fifth transistor and the third transistor sharing the base and an emitter: and
a sixth transistor for acquiring a current signal from a collector of the sixth transistor, the sixth transistor and the fourth transistor sharing the base and an emitter, wherein:
the first to fourth transistors each have an m-row of parallel connections of transistor elements;
the fifth and sixth transistors each have an n-row of parallel connections of transistor elements;
a resistor element is provided between the emitters of the fifth transistor and the sixth transistor, and a current source is added between an emitter terminal of each of the fifth transistor and the sixth transistor and the ground; and a transconductance (gm) is determined by m, n, and resistances of the resistor element.

14. A mixer circuit comprising:

a frequency conversion circuit for generating, from a first signal and a second signal, a third signal as a product; and a transconductance stage for receiving the first signal and carrying out voltage-current conversion of the first signal;

the transconductance stage comprising:

a first transistor and a second transistor each comprising a collector connected to a respective power source terminal, and each receiving an input signal from a respective base;

a third transistor comprising a collector connected to an emitter terminal of the first transistor and a fourth transistor comprising a collector connected to an emitter terminal of the second transistor, the collector of the third transistor being cross-coupled to a base of the fourth transistor, and the collector of the fourth transistor being cross-coupled to a base of the third transistor;

a fifth transistor for acquiring a current signal from a collector of the fifth transistor, the fifth transistor and the third transistor sharing the base and an emitter: and a sixth transistor for acquiring a current signal from a collector of the sixth transistor, the sixth transistor and the fourth transistor sharing the base and an emitter, wherein:

the first to fourth transistors each have an m-row of parallel connections of transistor elements;

the fifth and sixth transistors each have an n-row of parallel connections of transistor elements;

a resistor element is provided between the emitters of the fifth transistor and the sixth transistor, and a negative feedback resistor is added each between an emitter terminal of the fifth transistor and the ground, and between an emitter terminal of the sixth transistor and the ground; and a transconductance (gm) is determined by m, n, and resistances of the resistor element.

15. A quadrature mixer circuit comprising:

a first frequency conversion circuit for generating, from a first signal and a second signal, a third signal as a product;

a second frequency conversion circuit for generating, from the first signal and a fourth signal, a fifth signal as a product, wherein a transconductance stage for inputting the first signal is shared, the transconductance stage for receiving the first signal and carrying out voltage-current conversion of the first signal comprising:

a first transistor and a second transistor each comprising a collector connected to a respective power source terminal, and each receiving the input signal from a respective base;

a third transistor comprising a collector connected to an emitter terminal of the first transistor and a fourth transistor comprising a collector connected to an emitter terminal of the second transistor, the collector of the third transistor being cross-coupled to a base of the fourth transistor, and the collector of the fourth transistor being cross-coupled to a base of the third transistor;

a fifth transistor for acquiring a current signal from a collector of the fifth transistor, the fifth transistor and the third transistor sharing the base and an emitter: and a sixth transistor for acquiring a current signal from a collector of the sixth transistor, the sixth transistor and the fourth transistor sharing the base and an emitter, wherein:

the first to fourth transistors each have an m-row of parallel connections of transistor elements;

the fifth and sixth transistors each have an n-row of parallel connections of transistor elements;

a resistor element is provided between the emitters of the fifth transistor and the sixth transistor, and a current source is added to an emitter terminal of each of the fifth transistor and the sixth transistor; and a transconductance (gm) is determined by m, n, and resistances of the resistor element.

16. A quadrature mixer circuit comprising:

a transconductance stage for converting an input signal voltage to a current signal;

a first frequency conversion circuit connected to the transconductance stage and for converting the frequency of the current signal extracted from the transconductance stage;

a second frequency conversion circuit connected to the transconductance stage and for converting the frequency of the current signal extracted from the transconductance stage to a different frequency from the frequency converted by the first frequency conversion circuit;

the transconductance stage comprising:

a first transistor and a second transistor each comprising a collector connected to a respective power source terminal, and each receiving the input signal voltage from a respective base;

a third transistor comprising a collector connected to an emitter terminal of the first transistor and a fourth transistor comprising a collector connected to an emitter terminal of the second transistor, the collector of the third transistor being cross-coupled to a base of the fourth transistor, and the collector of the fourth transistor being cross-coupled to a base of the third transistor;

a fifth transistor for acquiring a current signal from a collector of the fifth transistor, the fifth transistor and the third transistor sharing the base and an emitter: and a sixth transistor for acquiring a current signal from a collector of the sixth transistor, the sixth transistor and the fourth transistor sharing the base and an emitter, wherein:

the first to fourth transistors each have an m-row of parallel connections of transistor elements;

the fifth and sixth transistors each have an n-row of parallel connections of transistor elements;

a resistor element is provided between the emitters of the fifth transistor and the sixth transistor, and a negative feedback resistor is added each between an emitter terminal of the fifth transistor and the ground, and between an emitter terminal of the sixth transistor and the ground; and a transconductance (gm) is determined by m, n, and resistances of the resistor element.

17. The mixer circuit according to claim 13, wherein the parallely connected transistors of each of the first to sixth transistors comprise equal voltages between respective bases and emitters.

18. The mixer circuit according to claim 13, wherein the number of parallel connections of the first transistor and the number of parallel connections of the third transistor are equal, and the number of parallel connections of the second transistor and the number of parallel connections of the fourth transistor are equal.

19. The mixer circuit according to any one of claims 13 to 16, wherein:
- a bias is inputted into a base terminal of the first transistor and into a base terminal of the second transistor via two resistors; and
- the first transistor and the second transistor each receive an input signal via a capacitor.

20. The mixer circuit according to any one of claims 13 to 16, wherein a bias is inputted into a base terminal of the first transistor and into a base terminal of the second transistor via two resistors, one of the first transistor and the second transistor being grounded via a capacitor, while the other transistor receiving an input signal via a capacitor.

21. The mixer circuit according to any one of claims 13 to 16, wherein a bias is inputted into a base terminal of the first transistor and into a base terminal of the second transistor via two resistors, one of the first transistor and the second transistor being supplied with the bias alone, while the other transistor receiving an input signal via a capacitor.

22. The mixer circuit according to any one of claims 13 to 16, wherein a current path is connected to a collector terminal of the fifth transistor and the sixth transistor.

23. A transconductance stage for carrying out voltage-current conversion, the transconductance stage comprising:
- a first transistor and a second transistor each comprising a collector connected to a respective power source terminal, and each receiving an input signal from a respective base;
- a third transistor comprising a collector connected to an emitter terminal of the first transistor and a fourth transistor comprising a collector connected to an emitter terminal of the second transistor, the collector of the third transistor being cross-coupled to a base of the fourth transistor, and the collector of the fourth transistor being cross-connected to a base of the third transistor;
- a fifth transistor for acquiring a current signal from a collector of the fifth transistor, the fifth transistor and the third transistor sharing the base and an emitter; and
- a sixth transistor for acquiring a current signal from a collector of the sixth transistor the sixth transistor and the fourth transistor sharing the base and an emitter, wherein:
- the first to fourth transistors each have an m-row of parallel connections of transistor elements;
- the fifth and sixth transistors each have an n-row of parallel connections of transistor elements;
- a resistor element is provided between the emitters of the fifth transistor and the sixth transistor,
- a first switching transistor is connected to the respective collector of the plurality of transistor elements constituting the fifth transistor;
- a second switching transistor is connected to the respective collector of the plurality of transistor elements constituting the sixth transistor; and
- a transconductance (gm) is determined by m, n, and resistances of the resistor element.

24. The voltage-current conversion circuit according to claim 23, wherein a negative feedback resistor is added each between an emitter terminal of the fifth transistor and the ground, and between an emitter terminal of the sixth transistor and the ground.

25. The voltage-current conversion circuit according to claim 23, wherein a current source is added each between an emitter terminal of the fifth transistor and the ground, and between an emitter terminal of the sixth transistor and the ground.

26. A voltage-current conversion circuit comprising a transconductance stage for carrying out voltage-current conversion, the transconductance stage comprising:
- a first transistor and a second transistor each comprising a collector connected to a respective power source terminal, and each receiving an input signal from a respective base;
- a third transistor comprising a collector connected to an emitter terminal of the first transistor and a fourth transistor comprising a collector connected to an emitter terminal of the second transistor, the collector of the third transistor being cross-coupled to a base of the fourth transistor, and the collector of the fourth transistor being cross-connected to a base of the third transistor;
- a fifth transistor for acquiring a current signal from a collector of the fifth transistor, the fifth transistor and the third transistor sharing the base and an emitter: and
- a sixth transistor for acquiring a current signal from a collector of the sixth transistor, the sixth transistor and the fourth transistor sharing the base and an emitter, wherein:
- the first to fourth transistors each have an m-row of parallel connections of transistor elements;
- the fifth and sixth transistors each have an n-row of parallel connections of transistor elements;
- at least one of the following (a) to (f) is provided between the emitter of the fifth transistor and the emitter of the sixth transistor:
  (a) an inductor element;
  (b) a capacitor element;
  (c) a resistor element, and an inductor element connected in-series to the resistor element;
  (d) a resistor element, and a capacitor element connected in-series to the resistor element;
  (e) a first resistor element, an inductor element connected in-series to the first resistor element, and a second resistor element connected in-series to the inductor element; or
  (f) a first resistor element, a capacitor element connected in-series to the first resistor element, and a second resistor element connected in-series to the capacitor element; and
- a transconductance (gm) is determined by m, n, and resistances of the resistor element.

27. An amplifier using a voltage-current conversion circuit, the voltage-current conversion circuit comprising:
- a first transistor and a second transistor each comprising a collector connected to a respective power source terminal, and each receiving an input signal from a respective base;
- a third transistor comprising a collector connected to an emitter terminal of the first transistor and a fourth transistor comprising a collector connected to an emitter terminal of the second transistor, the collector of the third transistor being cross-coupled to a base of the fourth transistor, and the collector of the fourth transistor being cross-connected to a base of the third transistor;
- a fifth transistor for acquiring a current signal from a collector of the fifth transistor, the fifth transistor and the third transistor sharing the base and an emitter; and
- a sixth transistor for acquiring a current signal form a collector of the sixth transistor, the sixth transistor and the fourth transistor sharing the base and an emitter, wherein:

the first to fourth transistors each have an m-row of parallel connections of transistor elements;
the fifth and sixth transistors each have an n-row of parallel connections of transistor elements;
a resistor element is provided between the emitters of the fifth transistor and the sixth transistor;
a current path is connected to a collector terminal of the fifth transistor or the sixth transistor; and
a transconductance (gm) is determined by m, n, and resistances of the resistor element.

28. An amplifier using a voltage-current conversion circuit, the voltage-current conversion circuit comprising:
a first transistor and a second transistor each comprising a collector connected to a respective power source terminal, and each receiving an input signal from a respective base;
a third transistor comprising a collector connected to an emitter terminal of the first transistor and a fourth transistor comprising a collector connected to an emitter terminal of the second transistor, the collector of the third transistor being cross-coupled to a base of the fourth transistor, and the collector of the fourth transistor being cross-connected to a base of the third transistor;
a fifth transistor for acquiring a current signal from a collector of the fifth transistor, the fifth transistor and the third transistor sharing the base and an emitter; and
a sixth transistor for acquiring a current signal from a collector of the sixth transistor, the sixth transistor and the fourth transistor sharing the base and an emitter, wherein:
the first to fourth transistors each have an m-row of parallel connections of transistor elements;
the fifth and sixth transistors each have an n-row of parallel connections of transistor elements;
a resistor element is provided between the emitters of the fifth transistor and the sixth transistor;
a first switching transistor is connected to the respective collector of the plurality of transistor elements constituting the fifth transistor;
a second switching transistor is connected to the respective collector of the plurality of transistor elements constituting the sixth transistor; and
a transconductance (gm) is determined by m, n, and resistances of the resistor element.

29. A mixer circuit using a voltage-current conversion circuit, the voltage-current conversion circuit comprising:
a first transistor and a second transistor each comprising a collector connected to a respective power source terminal, and each receiving an input signal from a respective base;
a third transistor comprising a collector connected to an emitter terminal of the first transistor and a fourth transistor comprising a collector connected to an emitter terminal of the second transistor, the collector of the third transistor being cross-coupled to a base of the fourth transistor, and the collector of the fourth transistor being cross-connected to a base of the third transistor;
a fifth transistor for acquiring a current signal from a collector of the fifth transistor, the fifth transistor and the third transistor sharing the base and an emitter; and
a sixth transistor for acquiring a current signal from a collector of the sixth transistor, the sixth transistor and the fourth transistor sharing the base and an emitter, wherein:
the first to fourth transistors each have an m-row of parallel connections of transistor elements;
the fifth and sixth transistors each have an n-row of parallel connections of transistor elements;
a resistor element is provided between the emitters of the fifth transistor and the sixth transistor;
a current path is connected to a collector terminal of the fifth transistor or the sixth transistor; and
a transconductance (gm) is determined by m, n, and resistances of the resistor element.

30. A mixer circuit using a voltage-current conversion circuit, the voltage-current conversion circuit comprising:
a first transistor and a second transistor each comprising a collector connected to a respective power source terminal, and each receiving an input signal from a respective base;
a third transistor comprising a collector connected to an emitter terminal of the first transistor and a fourth transistor comprising a collector connected to an emitter terminal of the second transistor, the collector of the third transistor being cross-coupled to a base of the fourth transistor, and the collector of the fourth transistor being cross-connected to a base of the third transistor; and
a fifth transistor for acquiring a current signal from a collector of the fifth transistor, the fifth transistor and the third transistor sharing the base and an emitter, and
a sixth transistor for acquiring a current signal from a collector of the sixth transistor, the sixth transistor and the fourth transistor sharing the base and an emitter, wherein:
the first to fourth transistors each have an m-row of parallel connections of transistor elements;
the fifth and sixth transistors each have an n-row of parallel connections of transistor elements;
a resistor element is provided between the emitters of the fifth transistor and the sixth transistor;
a first switching transistor is connected to the respective collector of the plurality of transistor elements constituting the fifth transistor;
a second switching transistor is connected to the respective collector of the plurality of transistor elements constituting the sixth transistor; and
a transconductance (gm) is determined by m, n, and resistances of the resistor element.

31. A mobile appliance using an LSI comprising a voltage-current conversion circuit, the voltage-current conversion circuit comprising:
a first transistor and a second transistor each comprising a collector connected to a respective power source terminal, and each receiving an input signal from a respective base;
a third transistor comprising a collector connected to an emitter terminal of the first transistor and a fourth transistor comprising a collector connected to an emitter terminal of the second transistor, the collector of the third transistor being cross-coupled to a base of the fourth transistor, and the collector of the fourth transistor being cross-connected to a base of the third transistor;
a fifth transistor for acquiring a current signal from a collector of the fifth transistor, the fifth transistor and the third transistor sharing the base and an emitter; and
a sixth transistor for acquiring a current signal from a collector of the sixth transistor, the sixth transistor and the fourth transistor sharing the base and an emitter, wherein:
the first to fourth transistors each have an m-row of parallel connections of transistor elements;

the fifth and sixth transistors each have an n-row of parallel connections of transistor elements;

a resistor element is located between the emitters of the fifth transistor and the sixth transistor; and a transconductance (gm) is determined by m, n, and resistances of the resistor element.

32. A mobile appliance using an LSI comprising a transconductance stage for carrying out voltage-current conversion, the transconductance stage comprising:

a first transistor and a second transistor each comprising a collector connected to a respective power source terminal, and each receiving an input signal from a respective base;

a third transistor comprising a collector connected to an emitter terminal of the first transistor and a fourth transistor comprising a collector connected to an emitter terminal of the second transistor, the collector of the third transistor being cross-coupled to a base of the fourth transistor, and the collector of the fourth transistor being cross-connected to a base of the third transistor;

a fifth transistor for acquiring a current signal from a collector of the fifth transistor, the fifth transistor and the third transistor sharing the base and an emitter, and a sixth transistor for acquiring a current signal from a collector of the sixth transistor and the fourth transistor sharing the base and an emitter, wherein:

the first to fourth transistors each have an m-row of parallel connections of transistor elements;

the fifth and sixth transistors each have an n-row of parallel connections of transistor elements;

a resistor element is provided between the emitters of the fifth transistor and the sixth transistor;

a first switching transistor is connected to the respective collector of the plurality of transistor elements constituting the fifth transistor;

a second switching transistor is connected to the respective collector of the plurality of transistor elements constituting the sixth transistor; and a transconductance (gm) is determined by m, n, and resistances of the resistor element.

33. A mobile appliance using an LSI comprising an amplifier, the amplifier comprising:

a first transistor and a second transistor each comprising a collector connected to a respective power source terminal, and each receiving an input signal from a respective base;

a third transistor comprising a collector connected to an emitter terminal of the first transistor and a fourth transistor comprising a collector connected to an emitter terminal of the second transistor, the collector of the third transistor being cross-coupled to a base of the fourth transistor, and the collector of the fourth transistor being cross-coupled to a base of the third transistor;

a fifth transistor for acquiring a current signal from a collector of the fifth transistor, the fifth transistor and the third transistor sharing the base and an emitter; and a sixth transistor for acquiring a current signal from a collector of the sixth transistor, the sixth transistor and the fourth transistor sharing the base and an emitter, wherein:

the first to fourth transistors each have an m-row of parallel connections of transistor elements;

the fifth and sixth transistors each have an n-row of parallel connections of transistor elements;

a resistor element is provided between the emitters of the fifth transistor and the sixth transistor, and a current source is added between an emitter terminal of each transistor;

an output load resistor is connected to each collector terminal of the fifth transistor and the sixth transistor; and a transconductance (gm) is determined by m, n, and resistances of the resistor element.

34. A mobile appliance using an LSI comprising an amplifier, the amplifier comprising:

a first transistor and a second transistor each comprising a collector connected to a respective power source terminal, and each receiving an input signal from a respective base;

a third transistor comprising a collector connected to an emitter terminal of the first transistor and a fourth transistor comprising a collector connected to an emitter terminal of the second transistor, the collector of the third transistor being cross-coupled to a base of the fourth transistor, and the collector of the fourth transistor being cross-connected to a base of the third transistor;

a fifth transistor for acquiring a current signal from a collector of the fifth transistor, the fifth transistor and the third transistor sharing the base and an emitter; and a sixth transistor for acquiring a current signal from a collector of the sixth transistor, the sixth transistor and the fourth transistor sharing the base and an emitter, wherein:

the first to fourth transistors each have an m-row of parallel connections of transistor elements;

the fifth and sixth transistors each have an n-row of parallel connections of transistor elements;

a resistor element is located between the emitters of the fifth transistor and the sixth transistor;

a negative feedback resistor is added each between an emitter terminal of the fifth transistor and the ground, and between an emitter terminal of the sixth transistor and the ground, and an output load resistor is connected to each collector terminal of the fifth transistor and the sixth transistor; and a transconductance (gm) is determined by m, n, and resistances of the resistor element.

35. A mobile appliance using an LSI comprising a mixer circuit, the mixer circuit comprising:

a transconductance stage for converting an input signal voltage to a current signal; and a frequency conversion circuit connected to the transconductance stage and for converting the frequency of the current signal acquired from the transconductance stage, the transconductance stage comprising:

a first transistor and a second transistor each comprising a collector connected to a respective power source terminal, and each receiving said input signal voltage from a respective base;

a third transistor comprising a collector connected to an emitter terminal of the first transistor and a fourth transistor comprising a collector connected to an emitter terminal of the second transistor, the collector of the third transistor being cross-coupled to a base of the fourth transistor, and the collector of the fourth transistor being cross-coupled to a base of the third transistor;

a fifth transistor for acquiring a current signal from a collector of the fifth transistor, the fifth transistor and the third transistor sharing the base and an emitter; and a sixth transistor for acquiring a current signal form a collector of the sixth transistor, the sixth transistor and the fourth transistor sharing the base and an emitter, wherein:

the first to fourth transistors each have an m-row of parallel connections of transistor elements;

the fifth and sixth transistors each have an n-row of parallel connections of transistor elements;

a resistor element is provided between the emitters of the fifth transistor and the sixth transistor, and a transconductance (gm) is determined by m, n, and resistances of the resistor element.

36. A mobile appliance using an LSI comprising a mixer circuit, the mixer circuit comprising:

a transconductance stage for converting an input signal voltage to a current signal;

a frequency conversion circuit connected to the transconductance stage and for converting the frequency of the current signal extracted from the transconductance stage, the transconductance stage comprising:

a first transistor and a second transistor each comprising a collector connected to a respective power source terminal, and each receiving an input signal from a respective base;

a third transistor comprising a collector connected to an emitter terminal of the first transistor and a fourth transistor comprising a collector connected to an emitter terminal of the second transistor, the collector of the third transistor being cross-coupled to a base of the fourth transistor, and the collector of the fourth transistor being cross-coupled to a base of the third transistor;

a fifth transistor for acquiring a current signal from a collector of the fifth transistor, the fifth transistor and the third transistor sharing the base and an emitter; and a sixth transistor for acquiring a current signal from a collector of the sixth transistor, the sixth transistor and the fourth transistor sharing the base and an emitter, wherein:

the first to fourth transistors each have an m-row of parallel connections of transistor elements;

the fifth and sixth transistors each have an n-row of parallel connections of transistor elements;

a resistor element is provided between the emitters of the fifth transistor and the sixth transistor, and a negative feedback resistor is added each between an emitter terminal of the fifth transistor and the ground, and between an emitter terminal of the sixth transistor and the ground; and a transconductance (gm) is determined by m, n, and resistances of the registor element.

37. A mobile appliance using an LSI comprising a quadrature mixer circuit, the quadrature mixer circuit comprising:

a transconductance stage for converting an input signal voltage to a current signal;

a first frequency conversion circuit connected to the transconductance stage and for converting the frequency of the current signal acquired from the transconductance stage;

a second frequency conversion circuit connected to the transconductance stage and for converting the frequency of the current signal acquired from the transconductance stage to a different frequency from the frequency converted by the first frequency conversion circuit;

the transconductance stage comprising:

a first transistor and a second transistor each comprising a collector connected to a respective power source terminal, and each receiving an input signal form a respective base;

a third transistor comprising a collector connected to an emitter terminal of the first transistor and a fourth transistor comprising a collector connected to an emitter terminal of the second transistor, the collector of the third transistor being cross-coupled to a base of the fourth transistor, and the collector of the fourth transistor being cross-coupled to a base of the third transistor;

a fifth transistor for acquiring a current signal from a collector of the fifth transistor, the fifth transistor and the third transistor sharing the base and an emitter; and a sixth transistor for acquiring a current signal from a collector of the sixth transistor, the sixth transistor and the fourth transistor sharing the base and an emitter, wherein:

the first to fourth transistors each have an m-row of parallel connections of transistor elements;

the fifth and sixth transistors each have an n-row of parallel connections of transistor elements;

a resistor element is provided between the emitters of the fifth transistor and the sixth transistor, and a current source is added to an emitter terminal of each of the fifth transistor and the sixth transistor; and a transconductance (gm) is determined by m, n, and resistances of the resistor element.

38. A mobile appliance using an LSI comprising a quadrature mixer circuit, the quadrature mixer circuit comprising:

a transconductance stage for converting an input signal voltage to a current signal;

a first frequency conversion circuit connected to the transconductance stage and for converting the frequency of the current signal acquired from the transconductance stage;

a second frequency conversion circuit connected to the transconductance stage and for converting the frequency of the current signal acquired from the transconductance stage to a different frequency from the frequency converted by the first frequency conversion circuit;

the transconductance stage comprising:

a first transistor and a second transistor each comprising a collector connected to a respective power source terminal, and each receiving an input signal from a respective base;

a third transistor comprising a collector connected to an emitter terminal of the first transistor and a fourth transistor comprising a collector connected to an emitter terminal of the second transistor, the collector of the third transistor being cross-coupled to a base of the fourth transistor, and the collector of the fourth transistor being cross-coupled to a base of the third transistor;

a fifth transistor for acquiring a current signal from a collector of the fifth transistor, the fifth transistor and the third transistor sharing the base and an emitter; and a sixth transistor for acquiring a current signal from a collector of the sixth transistor, the sixth transistor and the fourth transistor sharing the base and an emitter, wherein:

the first to fourth transistors each have an m-row of parallel connections of transistor elements;

the fifth and sixth transistors each have an n-row of parallel connections of transistor elements;

a resistor element is provided between the emitters of the fifth transistor and the sixth transistor, and a negative feedback resistor is added each between an emitter terminal of the fifth transistor and the ground, and between an emitter terminal of the sixth transistor and the ground; and a transconductance (gm) is determined by m, n, and resistances of the resistor element.

* * * * *